(12) United States Patent
Lee et al.

(10) Patent No.: US 9,257,181 B2
(45) Date of Patent: Feb. 9, 2016

(54) SENSE AMPLIFICATION CIRCUITS, OUTPUT CIRCUITS, NONVOLATILE MEMORY DEVICES, MEMORY SYSTEMS, MEMORY CARDS HAVING THE SAME, AND DATA OUTPUTTING METHODS THEREOF

(75) Inventors: Taesung Lee, Seoul (KR); Jaewoo Im, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 852 days.

(21) Appl. No.: 13/427,019

(22) Filed: Mar. 22, 2012

(65) Prior Publication Data
US 2012/0243342 A1 Sep. 27, 2012

Related U.S. Application Data

(60) Provisional application No. 61/466,538, filed on Mar. 23, 2011.

(30) Foreign Application Priority Data

May 6, 2011 (KR) ......................... 10-2011-0042986

(51) Int. Cl.
*G11C 7/00* (2006.01)
*G11C 16/04* (2006.01)
(Continued)

(52) U.S. Cl.
CPC ............ *G11C 16/0483* (2013.01); *G11C 16/26* (2013.01); *G11C 16/28* (2013.01); *G11C 2213/71* (2013.01)

(58) Field of Classification Search
CPC ...... G11C 16/28; G11C 16/26; G11C 7/1021; G11C 16/0491; G11C 16/32; G11C 16/3445; G11C 2207/2281; G11C 7/22; G11C 16/10
USPC ................ 365/189.05, 189.09, 203, 205, 207
See application file for complete search history.

(56) References Cited

U.S. PATENT DOCUMENTS 6,256,681 B1 * 7/2001 Chang ............................... 710/1
6,570,809 B1 * 5/2003 Lin ........................... 365/230.02
6,574,129 B1   6/2003 Tran
(Continued)

FOREIGN PATENT DOCUMENTS

JP   09-198886 A    7/1997
JP   2007-141393 A  6/2007
(Continued)

OTHER PUBLICATIONS

"Specification History", ONFi: Open Nand Flash Interface, http://onfi.org/specifications/.
(Continued)

*Primary Examiner* — Hien Nguyen
(74) *Attorney, Agent, or Firm* — Harness, Dickey & Pierce, P.L.C.

(57) ABSTRACT

An output circuit of a nonvolatile memory device includes a sense amplification circuit configured to, during a sensing operation, generate output data based on a comparison between a first voltage on a data line and a reference voltage on a reference data line during a sensing operation, the first voltage corresponding to data read from at least one memory cell, and the sense amplification circuit being further configured to connect the reference data line with a ground terminal during the sensing operation.

21 Claims, 24 Drawing Sheets

(51) Int. Cl.
  *G11C 16/26* (2006.01)
  *G11C 16/28* (2006.01)

(56) References Cited

U.S. PATENT DOCUMENTS

| | | | |
|---|---|---|---|
| 6,879,520 B2* | 4/2005 | Hosono et al. | 365/185.17 |
| 7,239,561 B2* | 7/2007 | Park | 365/189.07 |
| 7,379,333 B2 | 5/2008 | Lee et al. | |
| 7,468,914 B2 | 12/2008 | Toda | |
| 7,509,588 B2 | 3/2009 | Van Os et al. | |
| 8,339,854 B2* | 12/2012 | Yoon | 365/185.12 |
| 8,503,246 B2* | 8/2013 | Yoo et al. | 365/185.19 |
| 8,665,648 B2* | 3/2014 | Mun et al. | 365/185.18 |
| 8,885,419 B2* | 11/2014 | Park et al. | 365/185.29 |
| 2006/0120172 A1 | 6/2006 | Lee et al. | |
| 2007/0086243 A1* | 4/2007 | Jo | 365/185.08 |
| 2007/0121376 A1 | 5/2007 | Toda | |
| 2007/0157089 A1 | 7/2007 | Van Os et al. | |
| 2008/0273623 A1 | 11/2008 | Chung et al. | |
| 2010/0078701 A1 | 4/2010 | Shim et al. | |
| 2010/0082890 A1 | 4/2010 | Heo et al. | |
| 2010/0117141 A1 | 5/2010 | Shin et al. | |
| 2010/0140685 A1 | 6/2010 | Kang et al. | |
| 2010/0213527 A1 | 8/2010 | Shim et al. | |
| 2010/0224929 A1 | 9/2010 | Jeong et al. | |
| 2010/0229001 A1 | 9/2010 | Park et al. | |
| 2010/0229007 A1 | 9/2010 | Park | |
| 2010/0259983 A1 | 10/2010 | Yoon | |
| 2010/0306583 A1 | 12/2010 | Kim et al. | |
| 2010/0315875 A1 | 12/2010 | Kim et al. | |
| 2010/0322000 A1 | 12/2010 | Shim et al. | |
| 2011/0013458 A1 | 1/2011 | Seol | |
| 2011/0018036 A1 | 1/2011 | Hwang et al. | |

FOREIGN PATENT DOCUMENTS

| | | |
|---|---|---|
| JP | 2008-084439 A | 4/2008 |
| KR | 10-0795647 | 5/2007 |

OTHER PUBLICATIONS

"Next Generation Samsung Toggle DDR NAND Flash: Toward High Performance, Low Power", http://www.samsung.com/global/business/semiconductor/products/flash/Products_Toggle_DDR_NANDFlash.html.

* cited by examiner

SENSE AMPLIFICATION CIRCUITS, OUTPUT CIRCUITS, NONVOLATILE MEMORY DEVICES, MEMORY SYSTEMS, MEMORY CARDS HAVING THE SAME, AND DATA OUTPUTTING METHODS THEREOF

CROSS-REFERENCE TO RELATED APPLICATIONS

This application claims the benefit of U.S. Provisional Application No. 61/466,538, filed Mar. 23, 2011, and this application claims priority under 35 U.S.C. §119 to Korean Patent Application No. 10-2011-0042986, filed May 6, 2011, the entire contents of each of which are incorporated herein by reference.

BACKGROUND

1. Field

Example embodiments relate to amplification circuits, output circuits having the same, nonvolatile memory devices, memory systems, memory cards, and/or data outputting methods thereof.

2. Description of Conventional Art

Semiconductor memory devices are microelectronic components commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices and non-volatile memory devices. Non-volatile memories are capable of storing data even when the power is turned off. Non-volatile memory data storage modes include permanent and reprogrammable modes. Non-volatile memories are commonly used for program and microcode storage in a wide variety of applications including, for example, computers, avionics, telecommunications, and consumer electronics.

A typical example of a non-volatile memory device is a flash memory device. Recently, multi-bit memory devices storing multi-bit data in a memory cell are becoming more common as demand for higher densities of memory devices increases.

SUMMARY

At least some example embodiments provide nonvolatile memory devices capable of performing relatively high speed data output operations.

At least some example embodiments provide nonvolatile memory devices capable of reducing layout area.

At least one example embodiment provides an output circuit including: page buffer latches configured to latch data read from memory cells; sub data lines configured to receive voltages corresponding to the latched data in response to latch addresses; a data line connected with the sub data lines during a sensing operation; a reference data line to which a current path is formed during the sensing operation; and a sense amplification circuit configured to differentially sense the reference data line and the data line, and to output data corresponding to the sensing result, during the sensing operation.

At least one other example embodiment provides an output circuit including: a plurality of page buffer latches configured to latch data read from a plurality of memory cells; a plurality of sub data lines configured to receive voltages corresponding to the latched data in response to latch addresses; a data line connected to the plurality of sub data lines; a reference data line to which a current path is formed during a sensing operation; and a sense amplification circuit configured to, during the sensing operation, sense a voltage difference between the reference data line and the data line, and to output data corresponding to the sensed voltage difference.

According to at least some example embodiments, the output circuit may further include: a column selection circuit configured to connect the data line with the sub data lines sequentially in response to column addresses. The column selection circuit may include: a plurality of column selection transistors. Each of the plurality of column selection transistors may be configured to connect a sub data line from among the sub data lines with the data line in response to a column address from among the column addresses.

The reference data line may be coupled to a load element having a load corresponding to a load of the data line.

According to at least some example embodiments, the sense amplification circuit may include: a pre-charger configured to pre-charge the reference data line and the data line; a current path generator configured to form the current path to the reference data line after the reference data line and the data line are pre-charged; and a differential sense amplifier configured to sense a voltage difference between the reference data line and the data line.

The pre-charger may include at least one transistor configured to apply a power supply voltage to the reference data line and the data line in response to a pre-charge signal.

The current path generator may electrically connect the reference data line to a ground terminal during the sensing operation. The current path generator may change a voltage of the reference data line during the sensing operation.

When the current path generator lowers a voltage of the reference data line during the sensing operation, a falling slope (rate of decrease) of a voltage of the reference data line is slower than a falling slope (rate of decrease) of a voltage of the data line when the latched data is indicative of a decrease in the voltage of the data line.

A voltage variation of the reference data line may be less than that of the data line. For example, during the sensing operation, a voltage variation in the voltage of the reference data line may be a value between voltage values corresponding to the latched data.

According to at least some example embodiments, the current path generator may include: at least one current path transistor connected between the reference data line and a path node, the at least one current path transistor having a gate configured to receive a trim code; and a path forming transistor configured to connect the path node with a ground terminal in response to an inverted pre-charge signal. The trim code may vary according to an address for determining a physical location of a page buffer. The trim code may be implemented by at least one of an e-fuse, a laser fuse, and a register set.

The differential sense amplifier may include: a first transistor connected between a power terminal and an output node, and having a gate connected to an inverted output node; a second transistor connected between the power terminal and the inverted output node, and having a gate connected to the output node; a third transistor connected between the output node and a bias node, and having a gate connected to the inverted output node; a fourth transistor connected between the inverted output node and the bias node, and having a gate connected to the output node; and a fifth transistor configured to connect the bias node and a ground terminal during the sensing operation.

At least one other example embodiment provides a nonvolatile memory device including: a memory cell array including at least one memory block having memory cells connected with bit lines; page buffers configured to latch data read from memory cells corresponding to the bit lines, respectively; sub data lines configured to receive voltages corresponding to data latched at the page buffers in response to latch addresses, respectively; a column selection circuit configured to connect the sub data lines with corresponding data lines in response to column addresses; and an output driver configured to output data by sensing voltage differences between the data lines and corresponding reference data lines during a sensing operation, wherein a current path is formed to each of the reference data lines during the sensing operation.

At least one other example embodiment provides a nonvolatile memory device including: a memory cell array including at least one memory block having a plurality of memory cells, the plurality of memory cells being connected to a plurality of bit lines; a plurality of page buffers configured to latch data read from the plurality of memory cells via the plurality of bit lines; a plurality of sub data lines configured to receive a plurality of voltages corresponding to data latched at the plurality of page buffers in response to a plurality of latch addresses; a column selection circuit configured to connect the plurality of sub data lines with a corresponding plurality of data lines in response to a plurality of column addresses; and an output circuit configured to output data by sensing voltage differences between the plurality of data lines and a corresponding plurality of reference data lines during a sensing operation, wherein a current path is formed to each of the plurality of reference data lines during the sensing operation.

According to at least some example embodiments, the at least one memory block may be configured to have an all bit line architecture or an even-odd bit line architecture.

According to at least some example embodiments, each of the page buffers may include a page buffer latch, wherein even or odd ones of the bit lines are connected to the page buffer latch, and the page buffer latch is configured to latch data read from a corresponding one of the memory cells during a read operation, or to latch data input from an external device during a program operation.

According to at least some example embodiments, each page buffer may include a first page buffer latch and a second page buffer latch. The first page buffer latch may be connected to even ones of the bit lines, and configured to latch data read from a corresponding memory cell of the even bit lines during a read operation. The second page buffer latch may be connected to odd ones of the bit lines, and configured to latch data read from a corresponding memory cell of the odd bit lines during the read operation.

The sense amplification circuit may include: a pre-charger configured to pre-charge the reference data lines and the data lines in response to a pre-charge signal; a current path generator configured to generate a current flow to the reference data lines in response to an inverted pre-charge signal; and a differential sense amplifier configured to sense a voltage difference between the reference data lines and the data lines in response to a differential sense signal.

A read cycle for outputting data latched at each of the page buffers may include: a pre-charge period in which the data lines and the reference data lines are pre-charged; a develop period in which the page buffers are connected with corresponding ones of the data lines; and a sense period in which voltage differences between the developed data lines and the reference data lines are sensed.

During the pre-charge period, a power supply voltage may be applied to the reference data lines and the data lines in response to the pre-charge signal.

During the develop period, the sub data lines may be connected with corresponding ones of the data lines in response to the column addresses, and the latched data of the page buffers may be transferred to corresponding ones of the sub data lines.

During the sense period, voltage differences between the data lines and corresponding reference data lines may be sensed in response to a differential sense signal.

The nonvolatile memory device may further include: an input/output buffer configured to temporarily store the data output from the sense amplification circuit or data input from an external device.

The nonvolatile memory device may further include: a randomizing circuit configured to randomize data input from an external device during an input operation or to de-randomize the data output from the sense amplification circuit during an output operation.

At least one other example embodiment provides a data output method of a nonvolatile memory device including: latching data of memory cells via corresponding bit lines; transferring voltages corresponding to the latched data to a data line; and sensing a voltage difference between the data line and a reference data line, wherein the sensing includes forming a current path at the referenced data line.

At least one other example embodiment provides a data output method of a nonvolatile memory device, the method including: latching data output from a plurality of memory cells via a corresponding plurality of bit lines; transferring voltages corresponding to the latched data to a data line; and sensing a voltage difference between the data line and a reference data line, the sensing including forming a current path to the reference data line.

According to at least some example embodiments, the latching may include pre-charging the bit lines; and sensing voltage variations of the pre-charged bit lines.

At least one other example embodiment provides a memory system including: a nonvolatile memory device; and a memory controller configured to control the nonvolatile memory device. The nonvolatile memory device is configured to output data by: differentially sensing data lines; and sequentially transferring voltages corresponding to read data and form a current path to the reference data lines. The output data is provided to the memory controller.

At least one other example embodiment provides a memory system including: a nonvolatile memory device; and a memory controller configured to control the nonvolatile memory device. The nonvolatile memory device is configured to: during a sensing operation, read data by sensing a voltage difference between data lines and corresponding reference data lines, form a current path to the reference data lines, and output the read data to the memory controller.

At least one other example embodiment provides a sense amplification circuit including: a pre-charger configured to pre-charge a reference data line and a data line in response to a pre-charge signal; a current path generator configured to form a current path at the reference data line in response to an inverted version of the pre-charge signal; and a differential sense amplifier configured to sense a voltage difference between the reference data line and the data line in response to a sensing signal. During a sensing operation, data to be sensed is transferred to the pre-charge data line, and when a voltage of the data line is lowered by the transferred data, a falling slope of a voltage of the reference data line is slower than that of the data line.

At least one other example embodiment provides a sense amplification circuit including: a pre-charger configured to pre-charge a reference data line and a data line in response to a pre-charge signal; a current path generator configured to form a current path to the reference data line in response to an inverted pre-charge signal; and a differential sense amplifier configured to sense a voltage difference between the reference data line and the data line in response to a sensing signal. During a sensing operation, data to be sensed is transferred to the data line, and when a voltage of the data line is lowered by the transferred data, a rate of decrease of a voltage of the reference data line is less than a rate of decrease of a voltage of the data line.

At least one other example embodiment provides a data output method of a nonvolatile memory device. According to at least this example embodiment, the method includes: transferring output data to a data line; changing a voltage of a reference data line to generate a reference voltage having a given, desired or predetermined slope; and differentially sensing a voltage difference between the reference voltage and the data line.

At least one other example embodiment provides data output method of a nonvolatile memory device. According to at least this example embodiment, the method includes: transferring output data to a data line; changing a voltage of a reference data line to generate a reference voltage having a first slope; and sensing a voltage difference between the data line and the reference data line.

According to at least some example embodiments, the data output method may further include: applying a pre-charge voltage to the data line and the reference data line before transferring of output data to the data line.

The voltage of the reference line may be changed such that a falling slope (rate of decrease) of a voltage of the reference data line is slower than that of the data line when a voltage of the data line is lowered by the output data.

The voltage of the reference data line may be changed such that a rising slope (rate of increase) of a voltage of the reference data line is slower than that of the data line when a voltage of the data line is increased by the output data.

The sensing may include: discharging the data line and the reference data line.

At least one other example embodiment provides a nonvolatile memory device including: a plurality of output units, wherein each of the plurality of output units includes page buffer latches configured to latch data read from memory cells; sub data lines configured to receive voltages corresponding to the latched data in response to latch addresses; a data line connected with the sub data lines during a sensing operation; a reference data line connected with at least one current sink during the sensing operation; and a sense amplification circuit configured to differentially sense the reference data line and the data line during the sensing operation, and to output data corresponding to the sensing result.

At least one other example embodiment provides a nonvolatile memory device including: a plurality of output units, each of the plurality of output units including: a plurality of page buffer latches configured to latch data read from a plurality of memory cells; a plurality of sub data lines configured to receive a plurality of voltages corresponding to the latched data in response to a plurality of latch addresses; a data line connected with the plurality of sub data lines during a sensing operation; a reference data line connected with at least one current sink during the sensing operation; and a sense amplification circuit configured to sense a voltage difference between the reference data line and the data line during the sensing operation. The sense amplification circuit is further configured to output data corresponding to the sensed voltage difference.

According to at least some example embodiments, data from each of the plurality of output units may be output to an external device via one input/output line. Data from at least two output units of the plurality of output units may be output to an external device via an input/output line.

According to at least some example embodiments, the nonvolatile memory device may further include: an input/output buffer configured to at least one of output data from the sense amplification circuit to an external device, and receive data from the external device.

The input/output buffer may include: a first input/output buffer configured to operate in a single-ended transmission mode in response to a first transmission mode selection signal; and a second input/output buffer configured to operate in a differential transmission mode in response to a second transmission mode selection signal.

The nonvolatile memory device may further include: a transmission mode selector configured to generate the first and second transmission mode selection signals. The transmission mode selector may generate the first and second transmission mode selection signals according to a user configuration or an e-fuse configuration.

At least one other example embodiment provides a memory card including: at least one nonvolatile memory device configured to store user data; a buffer memory device configured to temporarily store data generated during operation; and a memory controller configured to control the at least one nonvolatile memory device and the buffer memory device. The at least one nonvolatile memory device includes: page buffer latches configured to latch data read from memory cells; sub data lines configured to receive voltages corresponding to the latched data in response to latch addresses; a data line connected with the sub data lines during a sensing operation; a reference data line connected with at least one current sink during the sensing operation; and a sense amplification circuit configured to differentially sense the reference data line and the data line during the sensing operation, and to output data corresponding to the sensing result.

At least one other example embodiment provides a memory card including: at least one nonvolatile memory device configured to store user data; a buffer memory device configured to temporarily store generated data; and a memory controller configured to control the at least one nonvolatile memory device and the buffer memory device. The at least one nonvolatile memory device includes: a plurality of page buffer latches configured to latch data read from a plurality of memory cells; a plurality of sub data lines configured to receive a plurality of voltages corresponding to the latched data in response to a plurality of latch addresses; a data line connected with the plurality of sub data lines during a sensing operation; a reference data line connected with at least one current sink during the sensing operation; and a sense amplification circuit configured to sense a voltage difference between the reference data line and the data line during the sensing operation. The sense amplification circuit is further configured to output data corresponding to the sensed voltage difference.

At least one other example embodiment provides an output circuit including: a sense amplification circuit configured to, during a sensing operation, generate output data based on a comparison between a first voltage on a data line and a reference voltage on a reference data line during a sensing operation, the first voltage corresponding to data read from at least one memory cell, and the sense amplification circuit being further configured to connect the reference data line with a ground terminal during the sensing operation.

According to at least some example embodiments, the sense amplification circuit may generate the output data while the reference data line is connected to the ground terminal.

The output circuit may further include: at least one page buffer latch configured to latch the data read from at least one memory cell; and/or a column selection circuit configured to connect the data line with the at least one page buffer in response to a column address signal.

The sense amplification circuit may include: a differential sense amplifier configured to, during the sensing operation, compare the first voltage and the reference voltage, and to generate the output data based on the comparison; and a current path generating circuit configured to connect the reference data line with the ground terminal during the sensing operation.

The sense amplification circuit may further include: a pre-charge circuit configured to pre-charge the reference data line and the data line in response to a pre-charge signal, wherein the current path generating circuit connects the reference data line with the ground terminal based on a trim code and an inverted pre-charge signal.

BRIEF DESCRIPTION OF THE FIGURES

Example embodiments will become apparent from the following description with reference to the following figures, wherein like reference numerals refer to like parts throughout the various figures unless otherwise specified, and wherein.

DETAILED DESCRIPTION

Figure 1:
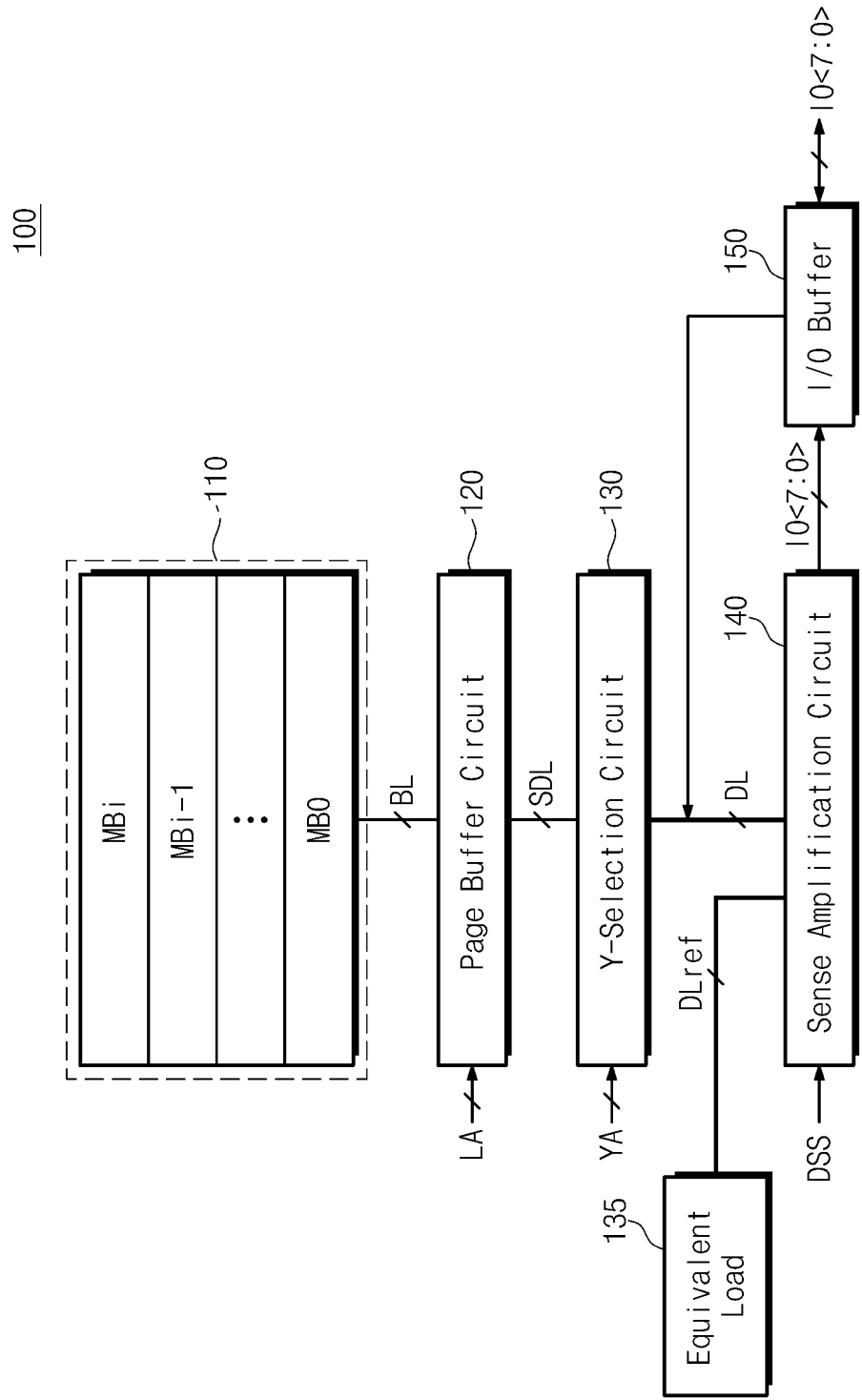
FIG. 1 is a block diagram illustrating a nonvolatile memory device according to an example embodiment of inventive concepts.

Inventive concepts are described more fully hereinafter with reference to the accompanying drawings, in which some example embodiments of the inventive concept are shown. Inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an example embodiment of inventive concepts may be a NAND flash memory, a vertical NAND flash memory, a NOR flash memory, a resistive random access memory (RRAM), a phase-change memory (PRAM), a magnetoresistive RAM (MRAM), a ferroelectric RAM (FRAM), a spin transfer torque RAM (STT-RAM), or the like. Below, for ease of description, a nonvolatile memory device may be assumed to be a NAND flash memory device.

FIG. 1 is a block diagram illustrating a nonvolatile memory device according to an example embodiment of inventive concepts.

Referring to FIG. 1, a nonvolatile memory device 100 may include a memory cell array 110, a page buffer circuit 120, a column selection (or, Y-selection) circuit 130, a sense amplification circuit 140, and an input/output (I/O) buffer 150.

The memory cell array 110 may include a plurality of memory blocks MB0 to MBi (i being a natural number). The plurality of memory blocks MB0 to MBi may share bit lines BL0 to BLn (n being a natural number). Each of the plurality of memory blocks MB0 to MBi may include a plurality of memory cells (not shown) for storing data.

The page buffer circuit 120 may read and store data from memory cells corresponding to the bit lines BL0 to BLn in a selected one of the memory blocks MB0 to MBi at a read operation. The page buffer circuit 120 may temporarily store input data at a program operation. Although not shown in FIG. 1, the page buffer circuit 120 may include page buffers corresponding to the bit lines BL0 to BLn, respectively.

Each page buffer may include a plurality of latches (not shown). Herein, at least one (called a page buffer latch) of the plurality of latches may be connected with a sub data line SDL in response to a corresponding latch address LA.

Although not shown in FIG. 1, each page buffer may include a pre-charge circuit configured to pre-charge a corresponding bit line and a sensing circuit configured to sense data from a memory cell connected with the corresponding bit line. Herein, the sensing circuit may be a current sensing circuit or a voltage sensing circuit.

A detailed description of an example page buffer circuit is disclosed in U.S. Pat. No. 7,379,333, the entirety of which is incorporated herein by reference.

The column selection circuit 130 may connect sub data lines SDL with corresponding data lines DL in response to a column address YA.

The sense amplification circuit 140 may output plural data bits IO<7:0> by performing differential sensing with respect to data lines DL and reference data lines DLref. Herein, each reference data line DLref may be coupled to an equivalent load 135. Herein, the equivalent load 135 may have the same or substantially the same load as a load (e.g., the column selection circuit 130, the sub data line SDL, etc.) connected with each data line DL. For example, the load may include a resistor, a capacitor, a reactor, etc.

In at least one example embodiment, each reference data line DLref may be configured to have the same or substantially the same length as a corresponding data line DL.

The reference data lines DLref may form a current path by the sense amplification circuit 140 during a sensing operation. For ease of description, forming a current path may mean that each reference data line DLref is electrically connected with a ground terminal. If each reference data line DLref is in a pre-charged state, its voltage may start to lower because a current path is formed during a sensing operation. In other words, each reference data line DLref may be lowered to a given, desired or predetermined voltage from a pre-charged voltage during the sensing operation. Herein, the given, desired or predetermined voltage may be about half the maximum value which a voltage of each reference data line DLref is capable of being lowered to. For example, each reference data line DLref may be lowered to a ground voltage from a power supply voltage.

In another example embodiment, each reference data line DLref may be connected electrically with a voltage terminal having a voltage higher than a pre-charge voltage of the reference data lines DLref and the data lines DL during the sensing operation.

At a read operation, the input/output buffer 150 may receive data IO<7:0> output from the sense amplification circuit 140 to output it to an external device. During a program operation, the input/output buffer 150 may transfer data IO<7:0> input from the external device to the sense amplification circuit 140.

The nonvolatile memory device 100 according to an example embodiment of inventive concepts may perform a high-speed data sensing operation by differentially sensing data.

Further, the nonvolatile memory device 100 according to an example embodiment of inventive concepts may reduce a layout area by performing differential sensing using reference data lines DLref connected with an equivalent load 135.

Figure 2:
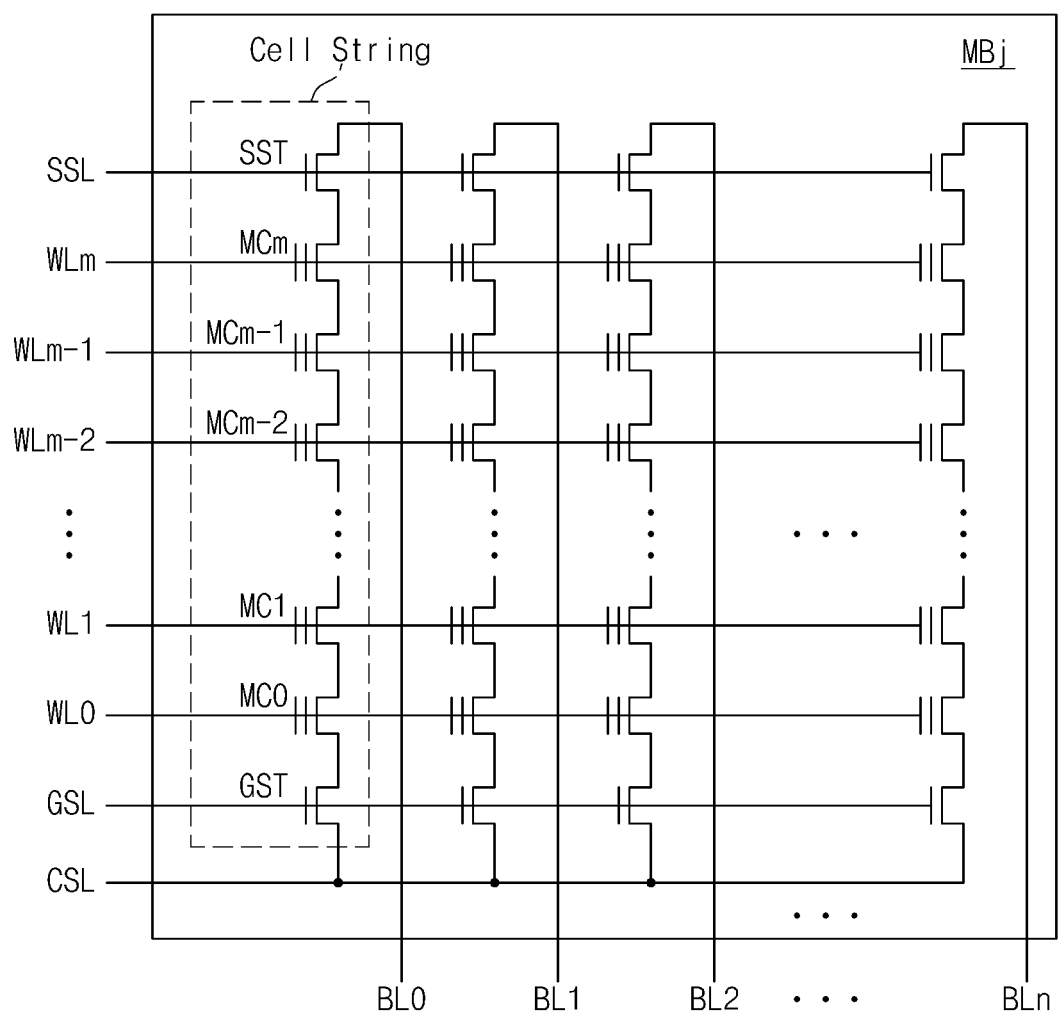
FIG. 2 is a diagram illustrating a memory block in FIG. 1 according to an example embodiment of inventive concepts.

FIG. 2 is a diagram illustrating a memory block in FIG. 1 according to an example embodiment of inventive concepts.

Referring to FIG. 2, a memory block MBj (j being an integer between 0 and i) may include a plurality of cell strings, each of which has a string selection transistor SST connected with a string selection line SSL, a plurality of memory cells MC0 to MCm connected with a plurality of word lines WL0 to WLm (m being a natural number), and a ground selection transistor GST connected with a ground selection line GSL.

Herein, the string selection transistor SST may be connected with a corresponding bit line, and the ground selection transistor GST may be connected with a common source line CSL. The common source line CSL may be biased by a ground voltage or a CSL voltage (e.g., a power supply voltage) from a CSL driver (not shown).

Each of the memory cells MC0 to MCm may store 1-bit data or multi-bit data.

The memory block MBj in FIG. 2 may have an all bit line architecture. In an example embodiment, all bit lines BL0 to BLn (n being a natural number) may be selected at the same or substantially the same time during a read or program operation. However, there is no need to select all bit lines at the same or substantially same time upon reading or programming.

Further description of an example all bit line architecture is disclosed in U.S. Pat. No. 7,379,333, the entirety of which is incorporated herein by reference.

Figure 3:
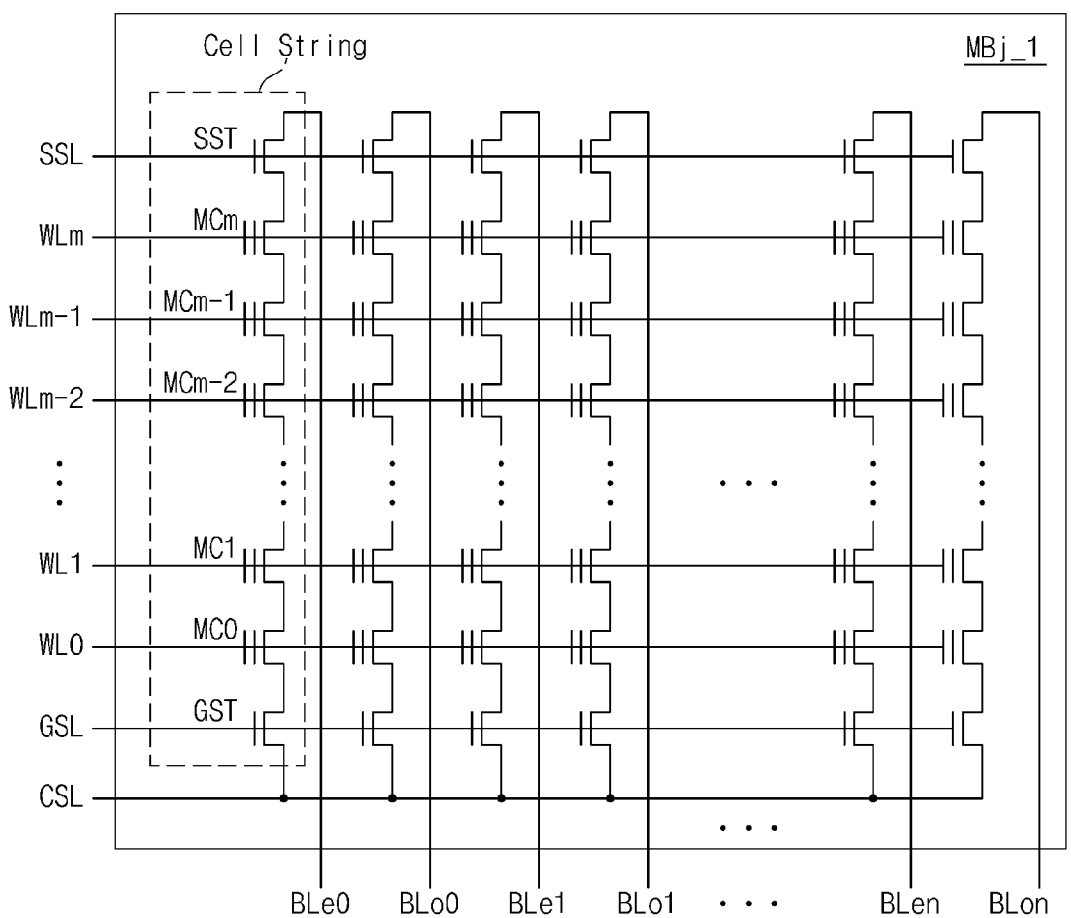
FIG. 3 is a diagram illustrating a memory block in FIG. 1 according to another example embodiment of inventive concepts.

FIG. 3 is a diagram illustrating a memory block in FIG. 1 according to another example embodiment of inventive concepts.

Referring to FIG. 3, a memory block MBj_1 (j being an integer between 0 and i) may include even bit lines BLe0 to BLen and odd bit lines BLo0 to BLon. The memory block MBj_1 in FIG. 3 may be implemented to have an even-odd bit line architecture. In an example embodiment, upon reading or programming, the even bit lines BLe0 to BLen may be firstly selected and then the odd bit lines BLo0 to BLon may be selected. In another example embodiment, upon reading or programming, the odd bit lines BLo0 to BLon may be firstly selected and then the even bit lines BLe0 to BLen may be selected.

Further description of an example even-odd bit line architecture is disclosed in U.S. Pat. No. 7,379,333, the entirety of which is incorporated herein by reference.

Figure 4:
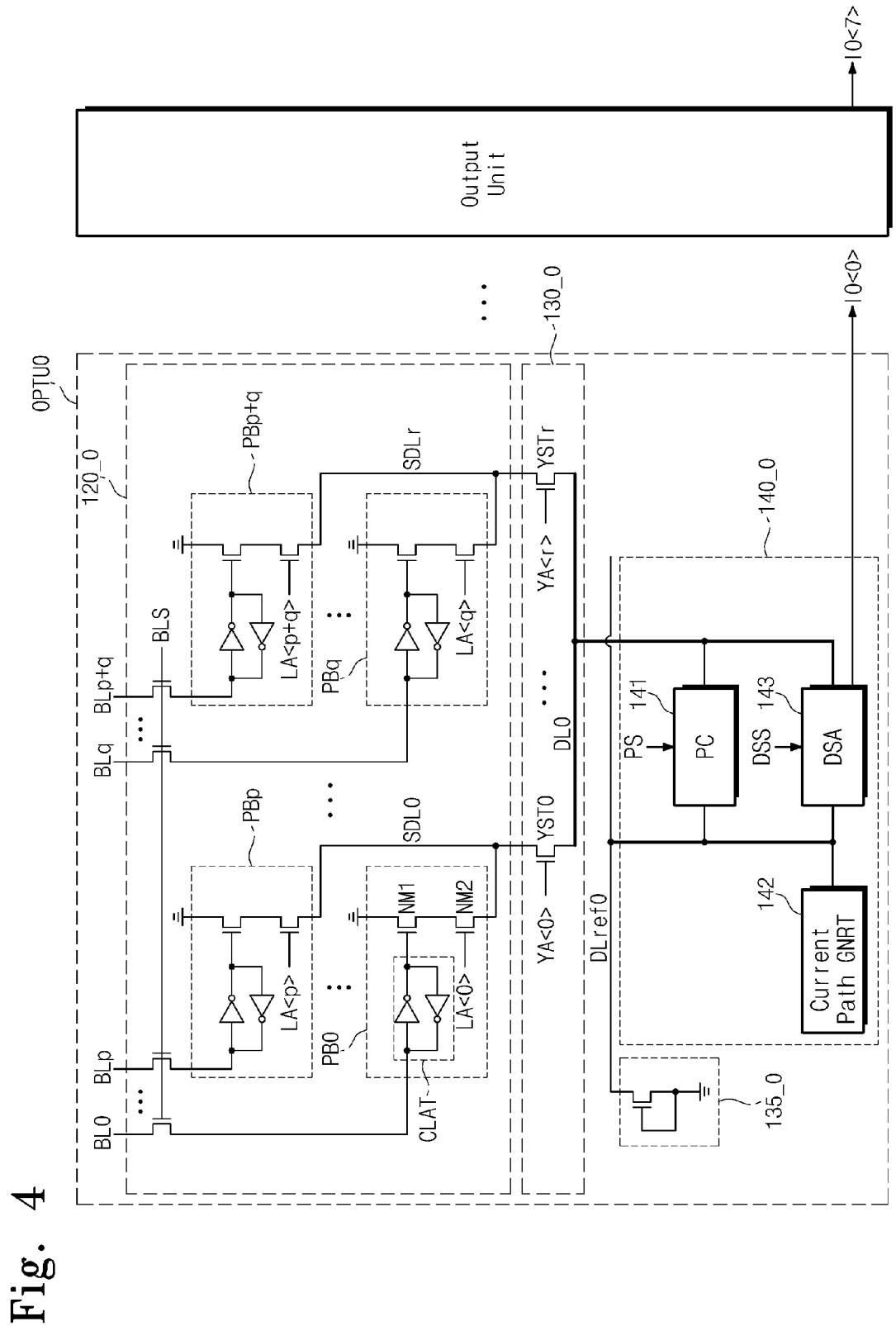
FIG. 4 is a diagram for describing an output operation of a nonvolatile memory device in FIG. 1 according to an example embodiment of inventive concepts.

FIG. 4 is a diagram for describing an example output operation of a nonvolatile memory device in FIG. 1 according to an example embodiment of inventive concepts. For ease of description, a data sensing method of an output operation (or, a read operation) will be described below. At the output operation a page buffer circuit 120, a column selection circuit 130, and a sense amplification circuit 140 may be referred to as an output circuit. Herein, the output circuit may include a plurality of output units OPTU0 to OPTU7, each of which outputs data IO<i> (i being an integer from 0 to 7) by performing differential sensing on data of a page buffer. Herein, the data IO<0> to IO<7> may be output to an external device via data lines.

For ease of description and example purposes, eight output units OPTU0 to OPTU7 are illustrated in FIG. 4. However, it is well understood that there is no need to limit the number of output units.

Below, the first output unit OUTP0 will be more fully described.

A page buffer circuit unit 120_0 may include a plurality of page buffers PB0 to PBp+q (p and q being an integer of 1 or more). The page buffers PB0 to PBp+q may be connected with sub data lines SDL0 to SDLr (r being an integer of 1 or more) by a given, desired or predetermined unit. For example, page buffers PB0 to PBp may be connected with a sub data line SDL0, and page buffers PBq to PBp+q may be connected with a sub data line SDLr. A page buffer circuit 120 in FIG. 1 may be formed of a plurality of page buffer circuit units.

Each of the page buffers PB0 to PBp+q may include a page buffer latch CLAT and NMOS transistors NM1 and NM2. For ease of description, a page buffer PB0 connected with a bit line BL0 will be described more fully. One end of the page buffer latch CLAT may be connected with the bit line BL0 in response to a bit line selection signal BLS, and the other end thereof may be connected with a gate of the NMOS transistor NM1. The NMOS transistors NM1 and NM2 may be connected in series between a ground terminal and the sub data line SDL0. A gate of the NMOS transistor NM2 may be connected to receive a latch address LA<0>. Data of the page buffer latch CLAT may be sent to the sub data line SDL0 in response to the latch address LA<0>.

In FIG. 4, for ease of description, there is exemplarily illustrated the case that each of the page buffers PB0 to PBp+q includes one cache latch CLAT (hereinafter, referred to as a page buffer latch). Although not shown in drawing, each of the page buffers PB0 to PBp+q according to an example embodiment of inventive concepts may further include a plurality of latches other than the page buffer latch CLAT.

A column selection circuit unit 130_0 may include a plurality of column selection transistors YST0 to YSTr. The column selection transistors YST0 to YSTr may be connected between corresponding sub data lines SDL0 to SDLr and the data line DL0, respectively. Herein, gates of the column selection transistors YST0 to YSTr may be connected to receive corresponding column addresses YA<0> to YA<r>, respectively. Sub data lines SDL0 to SDLr may be sequentially connected with the data line DL0 in response to the column addresses YA<0> to YA<r>.

A sense amplification circuit unit 140_0 may include a pre-charger 141, a current path generator 142, and a differential sense amplifier 143. The sense amplification circuit unit 140_0 may output data IO<0> by differentially sensing data latched at the page buffers PB0 to PBp+q in response to a differential sensing signal DSS. Herein, the data IO<0> may be output to an external device via a corresponding IO data line. A sense amplification circuit 140 in FIG. 1 may include a plurality of sense amplification circuit units.

The pre-charger 141 may be connected between a data line DL0 and a reference data line DLref0. When data latched at the page buffers PB0 to PBp+q is sensed, the pre-charger 141 may pre-charge the data line DL0 and the reference data line DLref0 in response to a pre-charge signal PS. In an example embodiment, the data line DL0 and the reference data line DLref0 may be pre-charged to a power supply voltage.

In an example embodiment, the reference data line DLref0 may be connected with an equivalent load 135_0. Herein, the equivalent load 135_0 may be configured to correspond to a load connected with the data line DL0. In an example embodiment, the equivalent load 135_0 may be implemented by a transistor as illustrated in FIG. 4.

The current path generator 142 may provide a current path to the reference data line DLref0 upon sensing of the data lines DL0 and DLref0. The current path generator 142 may be in an inactive state when the reference data line DLref0 and the data line DL0 are pre-charged and in an active state when data of the data line DL0 is sensed. That is, the current path generator 142 may interrupt a current path of the reference data line DLref0 when the data lines DL0 and DLref0 are pre-charged and may form a current path of the reference data line DLref0 pre-charged during a sensing operation.

In particular, the current path generator 142 may form a current path such that a ratio of a voltage variation of the data line DL0 to a voltage variation of the reference data line DLref0 is maintained with a given, desired or predetermined value during a sensing operation. For example, the current path generator 142 may be implemented such that a voltage variation of the reference data line DLref0 becomes less than that of the data line DL0. In particular, a voltage variation of the reference data line DLref0 may be about half a voltage variation of the data line DL0. That is, the current path generator 142 may be implemented such that a voltage variation is generated according to the following equation.

$$V_{DLref} = (V_{DL\_max} + V_{DL\_min})/2 \quad (1)$$

In the equation 1, $V_{DLref}$ may be a voltage variation of the reference data line DLref0, $V_{DL\_max}$ may be a maximum voltage of the data line DL0, and $V_{DL\_min}$ may be a minimum voltage of the data line DL0.

The current path generator 142 may constantly vary (increase or decrease) a voltage of the reference data line DLref0 regardless of a voltage of the data line DL0 (or, data latched at the page buffers PB0 to PBp+q). That is, the current path generator 142 may lower a voltage of the reference data line DLref0 regardless of a voltage of the data line DL0 during a sensing operation.

In an example embodiment, the current path generator 142 may be formed of at least one current sink activated during a sensing operation.

In another example embodiment, the current path generator 142 may be formed of at least one current source activated during a sensing operation.

The differential sense amplifier 143 may perform differential sensing on the data line DL0 and the reference data line DLref0 in response to the differential sense signal DSS. That is, during a sensing operation, the differential sense amplifier 143 may judge or determine whether latched data is '0' or '1', by sensing a voltage difference between a lowered voltage of the reference data line DLref0 and a voltage of the data line DL0. A detailed description of an example of the differential sense amplifier 143 is disclosed in U.S. Pat. No. 6,574,129, the entirety of which is incorporated herein by reference.

The output unit OPTU0 is described in detail herein. However, remaining output units OPTU1 to OPTU7 may be configured to have the same or substantially the same function and/or operation as that described above. Each of the output units OPTU0 to OPTU7 may output data by performing differential sensing on one data line and one reference data line.

In FIG. 4, data to be output to one IO data line may be output from each of the output units OPTU0 to OPTU7. However, inventive concepts are not limited thereto. Data to be output to one IO data line may be output from at least two output units.

Figure 5:
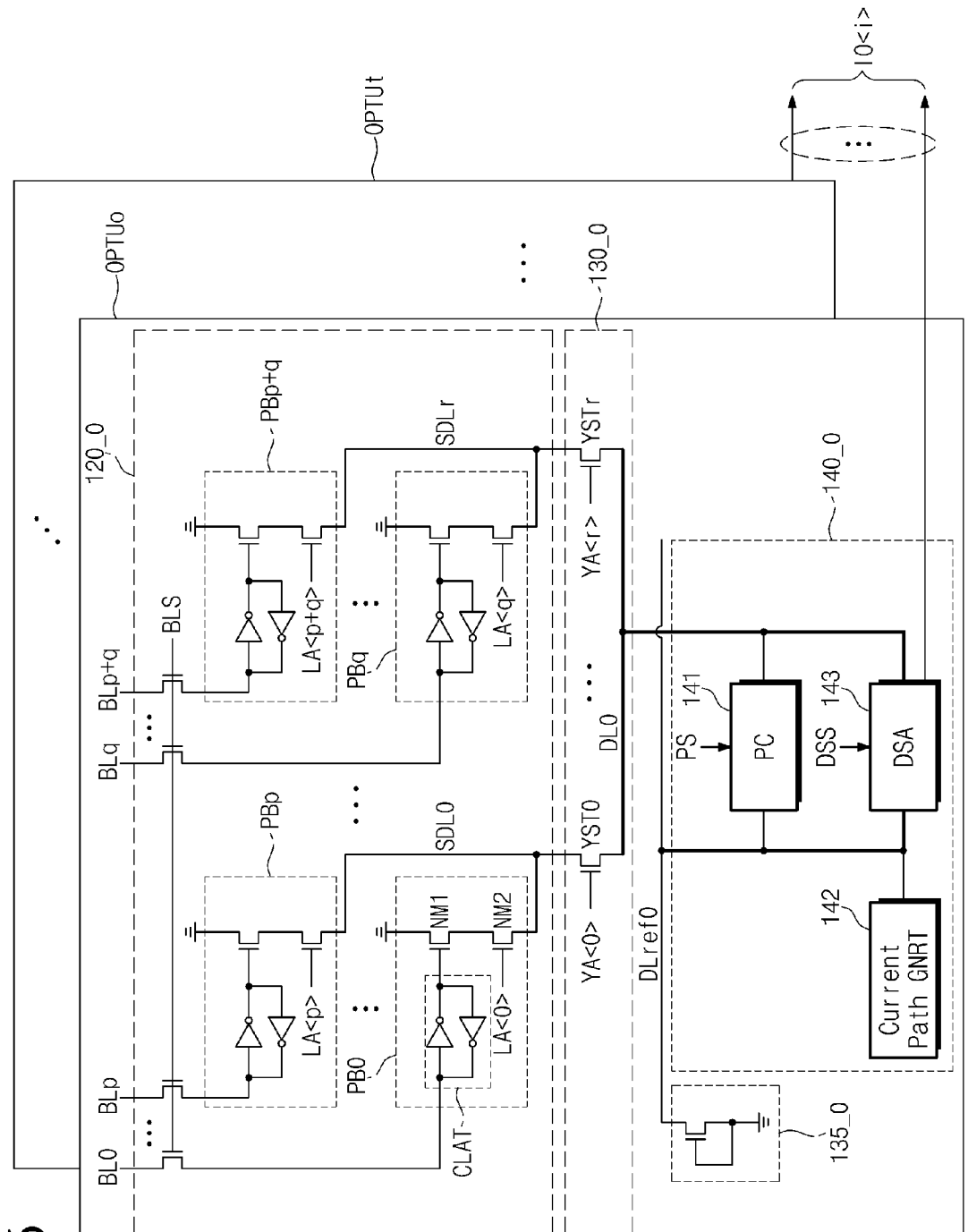
FIG. 5 is a diagram for describing an output operation of a nonvolatile memory device in FIG. 1 according to another example embodiment of inventive concepts.

FIG. 5 is a diagram for describing example output operation of a nonvolatile memory device in FIG. 1 according to another example embodiment of inventive concepts.

Referring to FIG. 5, output units OPTU0 to OPTUt (t being a natural number) may output data to be output to one IO line IO<i>. Herein, the output unit OPTU0 may be the same or substantially the same as that in FIG. 4, and thus, description thereof is omitted.

Figure 6:
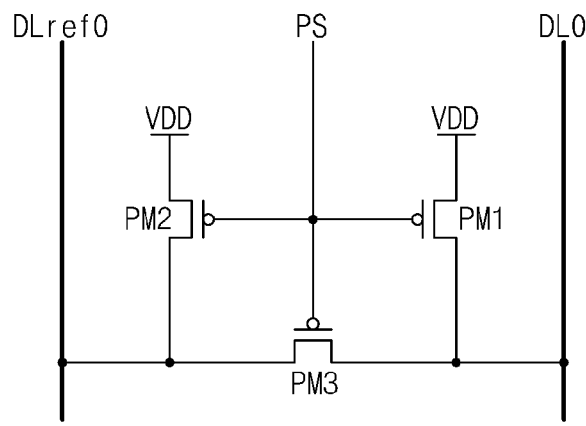
FIG. 6 is a diagram illustrating a pre-charger in FIG. 4 according to an example embodiment of inventive concepts.

FIG. 6 is a diagram illustrating a pre-charger in FIG. 4 according to an example embodiment of inventive concepts.

Referring to FIG. 6, a pre-charger 141 may include PMOS transistors PM1, PM2, and PM3. The PMOS transistor PM1 may be connected between a power terminal VDD and a data line DL0, the PMOS transistor PM2 may be connected between the power terminal VDD and a reference data line DLref0, and the PMOS transistor PM3 may be connected between the data line DL0 and the reference data line DLref0. Gates of the PMOS transistors PM1 to PM3 may be connected to receive a pre-charge signal PS. The pre-charger 141 may apply a power supply voltage to the data line DL0 and the reference data line DLref0 in response to the pre-charge signal PS.

Figure 7:
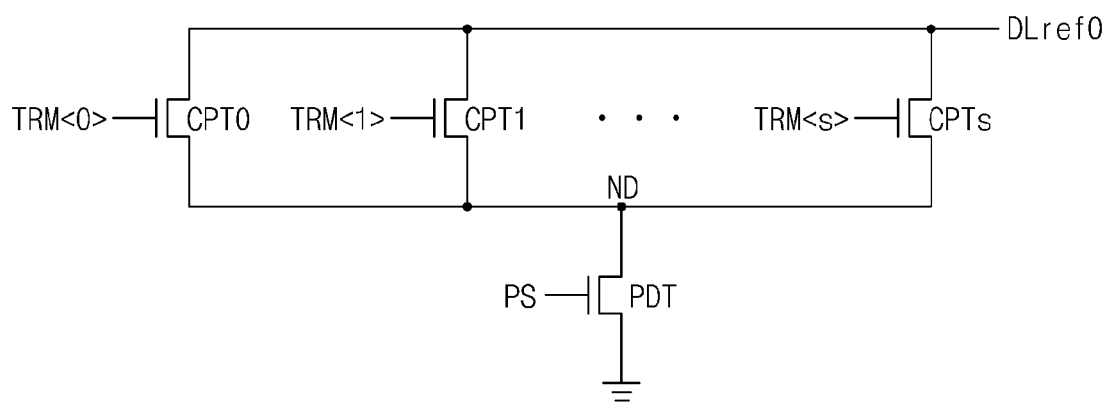
FIG. 7 is a diagram illustrating a current path generator 142 in FIG. 4 according to an example embodiment of inventive concepts.

FIG. 7 is a diagram illustrating a current path generator 142 in FIG. 4 according to an example embodiment of inventive concepts.

Referring to FIG. 7, a current path generator 142 may include a plurality of current path transistors CPT0 to CPTs and a pass forming transistor PDT. The current path transistors CPT0 to CPTs may be connected in parallel between a reference data line DLref0 and a path node ND. Herein, gates of the current path transistors CPT0 to CPTs may be connected to receive corresponding trim codes TRM<0> to TRM<s>, respectively.

In an example embodiment, the trim codes TRM<0> to TRM<s> may be fixed.

In another example embodiment, the trim codes TRM<0> to TRM<s> may be variable. For example, the trim codes TRM<0> to TRM<s> may be varied according to an address for selecting a memory block. Further, the trim codes TRM<0> to TRM<s> may be varied according to an address for determining a physical location of a page buffer.

In an example embodiment, the trim codes TRM<0> to TRM<s> may be formed of at least one of an e-fuse, a laser fuse, an anti-fuse, and a register set.

The path forming transistor PDT may be connected between the path node ND and a ground terminal. Herein, a gate of the path forming transistor PDT may be connected to receive a pre-charge signal PS. That is, the path forming transistor PDT may be turned on in response to the pre-charge signal PS. For example, when the pre-charge signal PS is at a low level, the path forming transistor PDT may be turned off. When the pre-charge signal PS is at a high level, the path forming transistor PDT may be turned on.

When the path forming transistor PDT is turned on (or, when the pre-charge signal PS is at a high level), the current path generator 142 may provide a current path to the reference data line DLref0 in response to the trim codes TRM<0> to TRM<s>.

The current path generator 142 in FIG. 7 may be a type of current sink. Herein, the current sink may be activated in response to the pre-charge signal PS.

The current path generator 142 in FIG. 7 may include a plurality of current path transistors CPT0 to CPTs. However, it is well understood that the current path generator is not limited to include a plurality of current path transistors. The current path generator 142 according to an example embodiment of inventive concepts may be configured to include at least one current path transistor.

Figure 8:
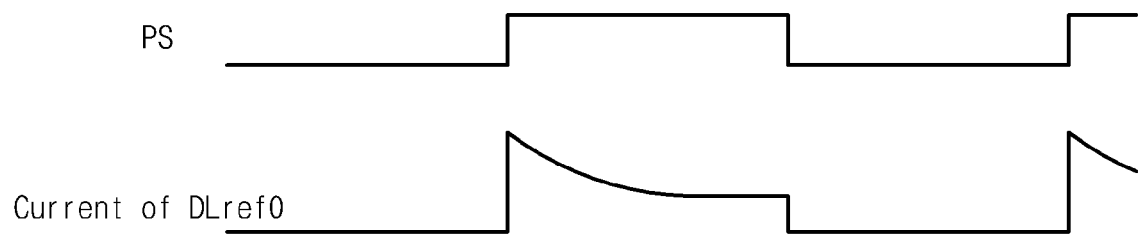
FIG. 8 is a timing diagram for describing example operation of a current path generator in FIG. 7.

FIG. 8 is a timing diagram for describing example operation of a current path generator in FIG. 7.

Referring to FIG. 8, when a pre-charge signal PS is at a low level, no current flows to a reference data line DLref0. When the pre-charge signal PS is at a high level, a current flows to the reference data line DLref0.

Figure 9:
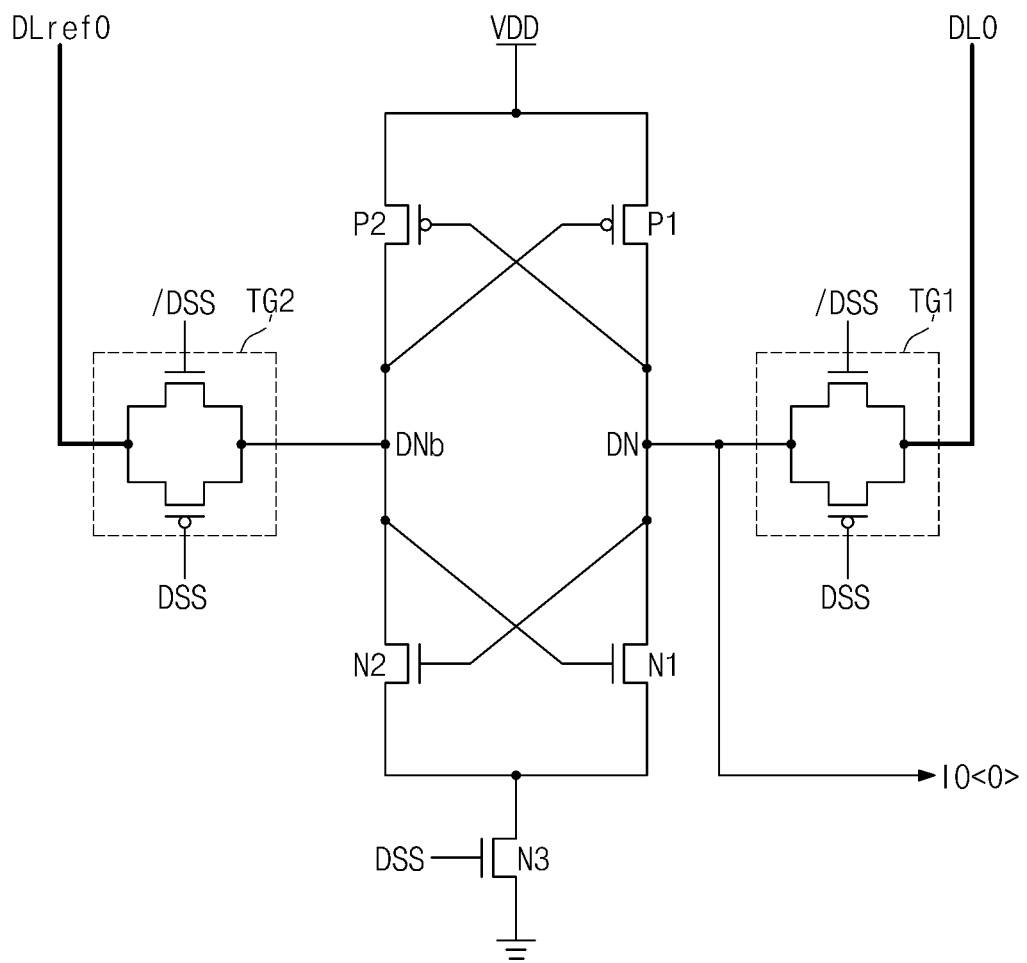
FIG. 9 is a diagram illustrating a differential sense amplifier in FIG. 4 according to an example embodiment of inventive concepts.

FIG. 9 is a diagram illustrating a differential sense amplifier in FIG. 4 according to an example embodiment of inventive concepts.

Referring to FIG. 9, a differential sense amplifier 143 may include PMOS transistors P1 and P2, NMOS transistors N1 to N3, and transmission gates TG1 and TG2.

The PMOS transistor P1 may be connected between a power terminal VDD and a data node DN, and the PMOS transistor P2 may be connected between the power terminal VDD and an inverted data node DNb. A gate of the PMOS transistor P1 may be connected with the inverted data node DNb, and a gate of the PMOS transistor P2 may be connected with the data node DN. Data IO<0> may be output from the data node DN. Alternatively, data IO<0> may be output from the inverted data node DNb.

The NMOS transistor N1 may be connected between the data node DN and a bias node BN, the NMOS transistor N2 may be connected between the inverted data node DNb and the bias node BN, and the NMOS transistor N3 may be connected between the bias node BN and a ground terminal. A gate of the NMOS transistor N1 may be connected with the inverted data node DNb, a gate of the NMOS transistor N2 may be connected with the data node DN, and a gate of the NMOS transistor N3 may be connected to receive a differential sense signal DSS.

The transmission gate TG1 may connect a data line DL0 with the data node DN in response to the differential sense signal DSS, and the transmission gate TG2 may connect a reference data line DLref0 with the inverted data node DNb in response to the differential sense signal DSS.

The differential sense amplifier 143 may sense a voltage difference between the data line DL0 and the reference data line DLref0 in response to the differential sense signal DSS, and may output the sensed result as data.

Figure 10:
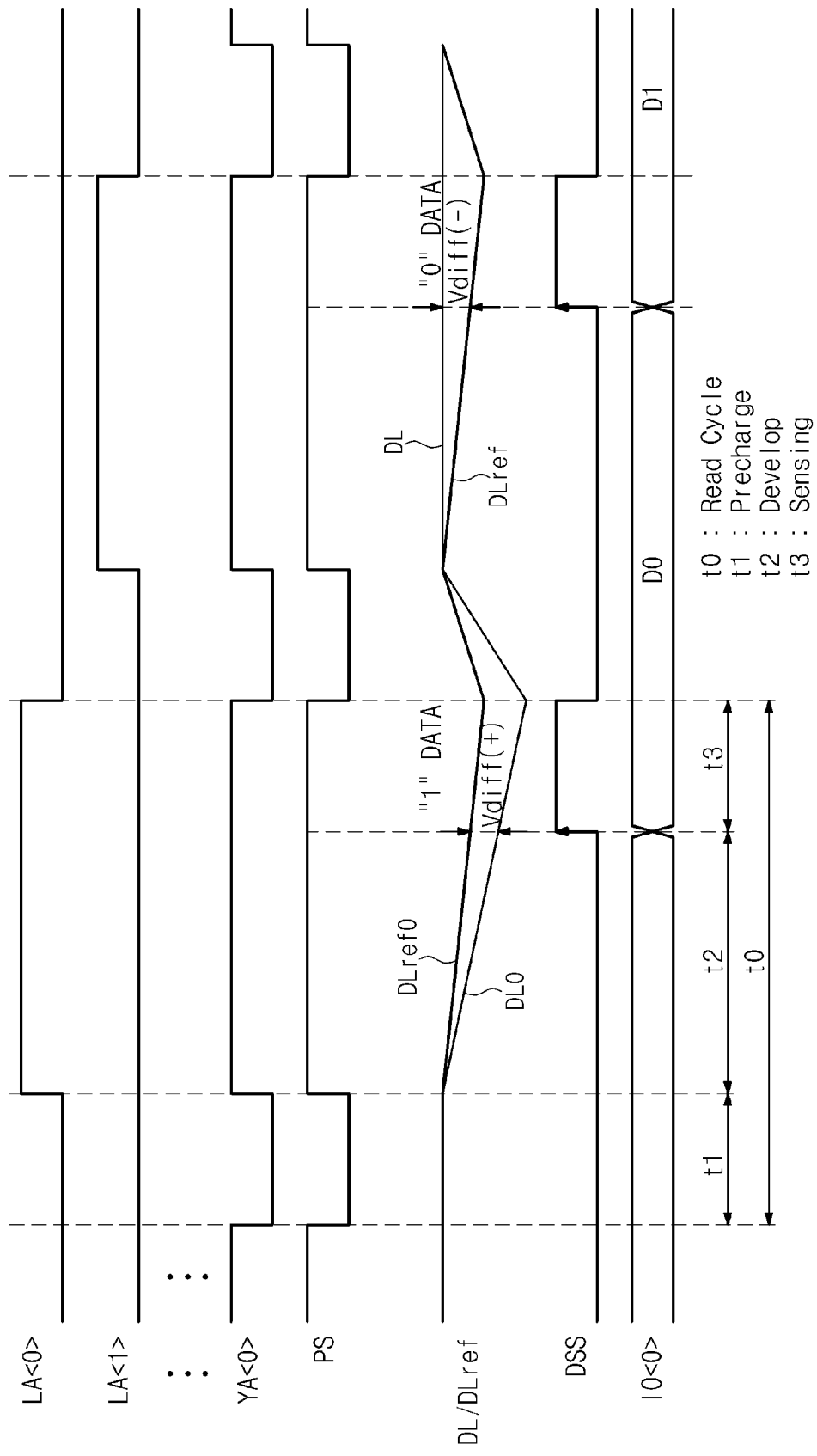
FIG. 10 is a timing diagram illustrating a data output operation according to an example embodiment of inventive concepts.

FIG. 10 is a timing diagram illustrating a data output operation according to an example embodiment of inventive concepts. FIG. 10 shows an example operation of outputting data latched at the first and second page buffers PB0 and PB1. Referring to FIGS. 4 to 9, a read cycle period t0 may be divided into a pre-charge period t1, a develop period t2, and a sense period t3. In an example embodiment, the pre-charge period t1 may be about 5 ns, the develop period t2 may be about 3 ns, and the sense period t3 may be about 2 ns. However, times corresponding to the periods t1, t2, and t3 are not limited thereto.

First, an operation of outputting data latched at a page buffer latch CLAT of the first page buffer PB0 will be described.

During the pre-charge period t1, data lines DL0 and DLref0 may be pre-charged in response to a low level of a pre-charge signal PS. Herein, the data lines DL0 and DLref0 may be pre-charged with a power supply voltage.

During the develop period t2, the first latch address LA<0> and the first column address YA<0> may have a high level. The page buffer latch CLAT of the first page buffer PB0 may be connected with a sub data line SDL0 in response to the high level of the first latch address LA<0>. A voltage corresponding to data latched at the page buffer latch CLAT of the first page buffer PB0 may be applied to the sub data line SDL0. Below, for ease of description, it is assumed that data latched at the page buffer latch CLAT of the first page buffer PB0 is '1' and a voltage corresponding to the data '1' is a ground voltage.

Further, the sub data line SDL0 may be connected with a data line DL0 in response to the high level of the column address YA<0>. Since a voltage of the sub data line SDL0 is a ground voltage and a voltage of the data line DL0 is a power supply voltage, a voltage of the data line DL0 may start to lower. At the same or substantially the same time, since a current path is formed at a reference data line DLref0, a voltage of the reference data line DLref0 may lower. Since half a current flowing to the data line DL0 flows to the reference data line DLref0, a falling slope of a voltage of the reference data line DLref0 may be slower than that of the data line DL0. Accordingly, during the develop period t2, a voltage of the reference data line DLref0 may be higher than that of the data line DL0. That is, a difference Vdiff of a voltage of the reference data line DLref0 minus a voltage of the data line DL0 may be a positive voltage.

During the sense period t3, the first latch address LA<0> and the first column address YA<0> may have a high level, and the data sense signal DSS may have a high level. The differential sense amplifier 143 may sense a voltage difference Vdiff between the reference data line DLref0 and the data line DL0 in response to a high level of the data sense signal DSS. At this time, since the voltage difference Vdiff is a positive voltage, a voltage (e.g., a ground voltage) corresponding to data '1' may be output to the data node DN.

Afterwards, data latched at a page buffer latch CLAT of the second page buffer PB1 may be output in a manner similar or substantially similar to that described above.

At the pre-charge period t1, the data lines DL0 and DLref0 may be pre-charged in response to a low level of the pre-charge signal PS. Herein, the data lines DL0 and DLref0 may be pre-charged with a power supply voltage.

During the develop period t2, the second latch address LA<1> and the first column address YA<0> may have a high level.

The page buffer latch CLAT of the second page buffer PB1 may be connected with the sub data line SDL0 in response to the high level of the second latch address LA<1>. A voltage corresponding to data latched at the page buffer latch CLAT of the second page buffer PB1 may be applied to the sub data line SDL0. Below, for ease of description, it is assumed that data latched at the page buffer latch CLAT of the second page buffer PB1 is '0' and a voltage corresponding to the data '0' is a power supply voltage.

Further, the sub data line SDL0 may be connected with a data line DL0 in response to the high level of the column address YA<0>. Since a voltage of the sub data line SDL0 is a power supply voltage and a voltage of the data line DL0 is a power supply voltage, a voltage of the data line DL0 may be maintained. At the same time, since a current path is formed at the reference data line DLref0, a voltage of the reference data line DLref0 may lower. Accordingly, during the develop period t2, a voltage of the reference data line DLref0 may be lower than that of the data line DL0. That is, a difference Vdiff of a voltage of the reference data line DLref0 minus a voltage of the data line DL0 may be a negative voltage.

The develop period t2 may be a period where a reference voltage of the reference data line DLref0 is discharged along a given, desired or predetermined slope. Herein, a value of the given, desired or predetermined slope may be larger than that of a falling slope of a voltage of the data line DL0. In this case, a current path generator 142 may be a kind of discharge circuit.

During the sense period t3, the second latch address LA<1> and the first column address YA<0> may maintain a high level, and the data sense signal DSS may have a high level. The differential sense amplifier 143 may sense a voltage difference Vdiff between the reference data line DLref0 and the data line DL0 in response to a high level of the data sense signal DSS. At this time, since the voltage difference Vdiff is a negative voltage, a voltage (e.g., a power supply voltage) corresponding to data '0' may be output to the data node DN.

By the data output method of the nonvolatile memory device according to an example embodiment of inventive concepts, it is possible to rapidly sense data according to whether a voltage difference Vdiff between the reference data line DLref0 and the data line DL0 is a positive voltage or a negative voltage.

The data output method in FIG. 10 may include pre-charging the reference data line DLref0 and the data line DL0. However, it is well understood that pre-charging of the data lines DLref0 and DL0 may be excluded from the data output method according to an example embodiment of inventive concepts. In inventive concepts, it is possible to sense and output data without pre-charging of the data lines DLref0 and DL0. For example, when a voltage of a data line increases due to output data, the data output method may be implemented such that a rising slope of a voltage of the reference data line DLref0 may become slower than that of the data line DL0. Accordingly, data transferred to a data line may be sensed and output during a sensing operation. Afterwards, a reference data line and a data line may be discharged for a data output of a next cycle.

Figure 11:
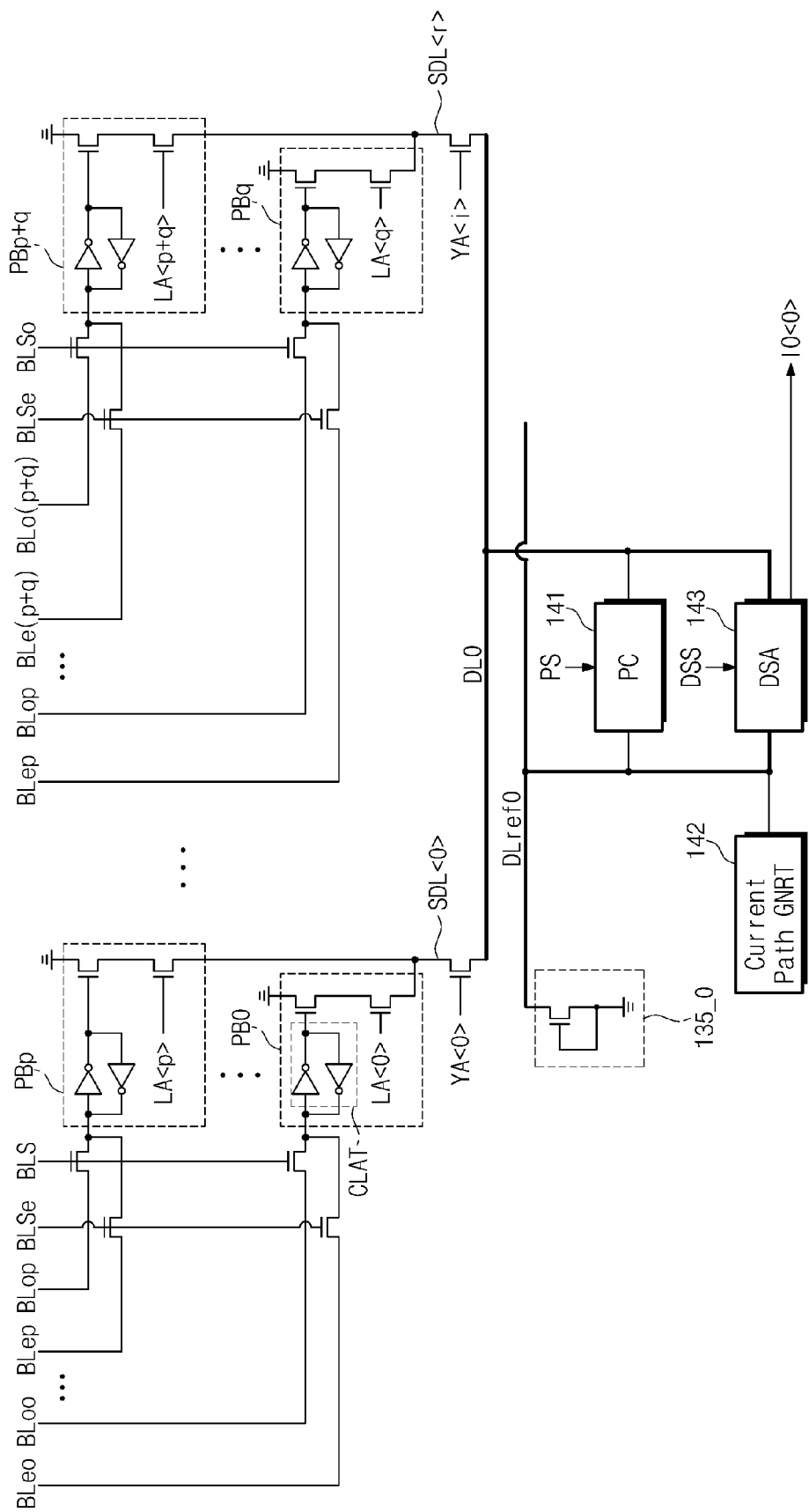
FIG. 11 is a diagram illustrating an output operation of a nonvolatile memory device in FIG. 1 according to another example embodiment of inventive concepts.

FIG. 11 is a diagram illustrating an output operation of a nonvolatile memory device in FIG. 1 according to another example embodiment of inventive concepts.

Referring to FIG. 11, an output operation may be divided into a data output operation associated with an even bit line and a data output operation associated with an odd bit line as compared with an output operation illustrated in FIG. 4. For example, the data output operation may include connecting an even bit line to a corresponding page buffer latch in response to an even bit line selection signal BLSe or connecting an odd bit line to a corresponding page buffer latch in response to an odd bit line selection signal BLSo. The output operation in FIG. 11 may be similar or substantially similar to that described in FIGS. 6 to 10 except for the above-described difference.

As illustrated in FIG. 11, a page buffer latch CLAT of each page buffer may be connected with an even bit line and an odd bit line. However, the page buffers are not limited thereto. Each page buffer may be configured to include a page buffer latch for an even bit line and a page buffer latch for an odd bit line.

Figure 12:
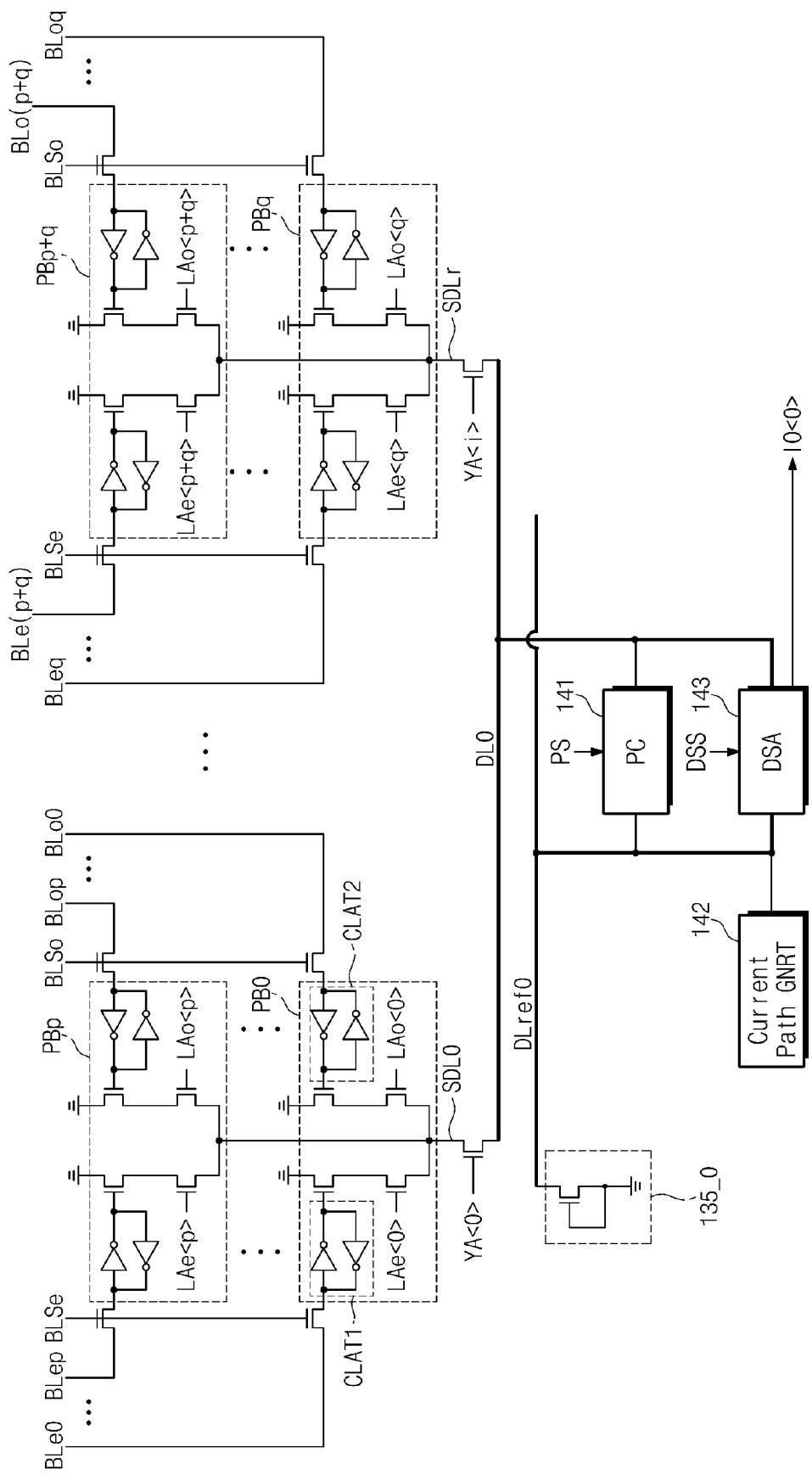
FIG. 12 is a diagram illustrating an output operation of a nonvolatile memory device in FIG. 1 according to still another example embodiment of inventive concepts.

FIG. 12 is a diagram illustrating an output operation of a nonvolatile memory device in FIG. 1 according to still another example embodiment of inventive concepts.

Referring to FIG. 12, each page buffer may include the first page buffer latch CLAT1 for an even bit line and the second page buffer latch CLAT2 for an odd bit line. For example, a data output operation may include connecting an even bit line to the first page buffer latch CLAT1 in response to an even bit line selection signal BLSe or connecting an odd bit line to the second page buffer latch CLAT2 in response to an odd bit line selection signal BLSo. The output operation in FIG. 12 may be similar or substantially similar to that described in FIGS. 6 to 10 except for the above-described difference.

Figure 13:
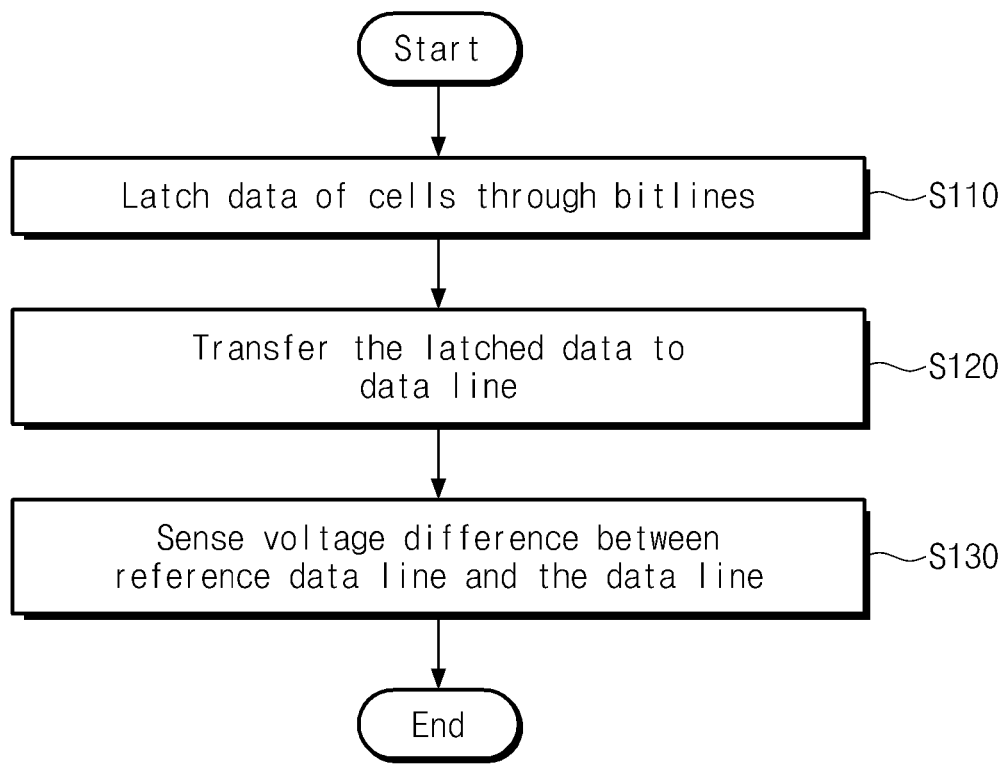
FIG. 13 is a flowchart illustrating a data output method of a nonvolatile memory device according to an example embodiment of inventive concepts.

FIG. 13 is a flowchart illustrating a data output method of a nonvolatile memory device according to an example embodiment of inventive concepts. Below, a data output method of a nonvolatile memory device will be more fully described with reference to FIGS. 1 to 13.

During a data output operation (or, a read operation), data of memory cells connected with a selected word line selected may be latched by page buffer latches of page buffers via corresponding bit lines BL. This may be performed in operation S110.

Voltages corresponding to data latched at the page buffer latches may be transferred to sub data lines SDL in response to latch addresses LA<0>, LA<1>, etc. The sub data lines SDL may be connected with a data line DL in response to column addresses YA. Thus, data stored in the page buffer latches is transferred to the data line DL. This may be performed in operation S120.

In operation S130, a voltage difference between a reference data line DLref and the data line DL may be sensed in response to a data sense signal DSS. Herein, during a sensing operation, a current path may be formed at the reference data line DLref. The sensed data may be buffered and output to an external device.

In case of the data output method according to an example embodiment of inventive concepts, data may be output rapidly by connecting a data line DL with page buffers which data is latched at and sensing a voltage difference between a reference data line DLref and the data line DL.

A nonvolatile memory device according to an example embodiment of inventive concepts may be configured to randomize input data before storing of the input data and to de-randomize stored data before outputting of the stored data.

Figure 14:
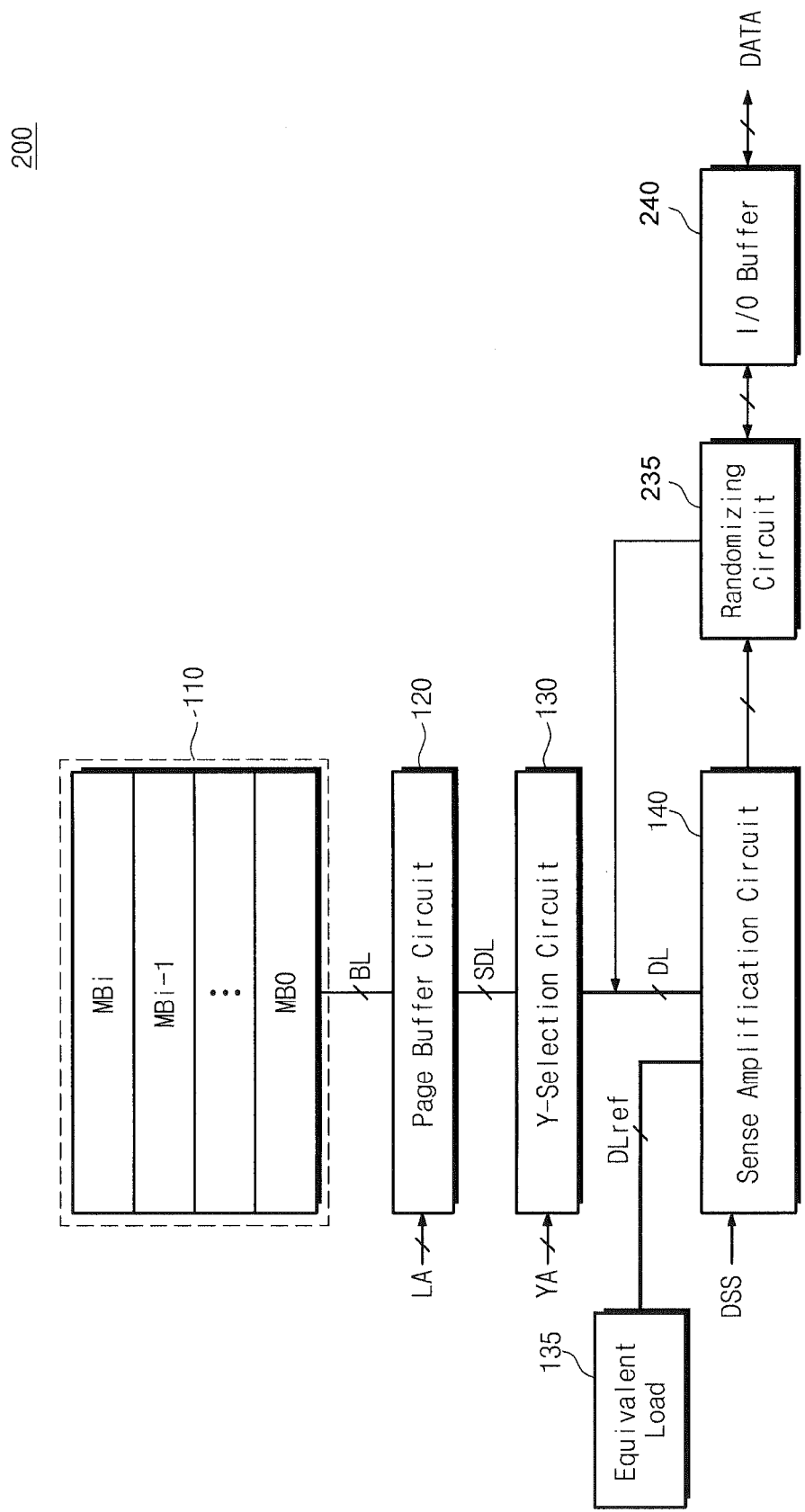
FIG. 14 is a diagram illustrating a nonvolatile memory device according to another example embodiment of inventive concepts.

FIG. 14 is a diagram illustrating a nonvolatile memory device according to another example embodiment of inventive concepts.

Referring to FIG. 14, a nonvolatile memory device 200 may further include a randomizing circuit 235 as compared with that 100 in FIG. 1. The randomizing circuit 235 may be configured to randomize data input from an input/output buffer 240 during an input operation and to de-randomize data provided from a sense amplification circuit 140 during an output operation. The nonvolatile memory device 200 in FIG. 14 may be the same or substantially the same as that in FIG. 1 except for the above-described difference.

Detailed description of an example of the randomizing circuit 235 is disclosed in U.S. Patent Publication Nos. 2010/0229001, 2010/0229007, and 2010/0259983, the entirety of each of which is incorporated herein by reference.

The reliability of data may be improved by randomizing data at data input/output.

A sense amplification circuit according to an example embodiment of inventive concepts is applicable to, for example, a single data rate (SDR) or double data rate (DDR) NAND flash memory. The SDR NAND flash memory is disclosed at, for example, (http://onfi.org/specifications/), the entirety of which is incorporated herein by reference. Further, the DDR NAND flash memory is disclosed at (http://www.samsung.com/global/business/semiconductor/products/flash/Products_Toggle_DDR_NANDFlash.html), the entirety of which is incorporated herein by reference.

A nonvolatile memory device according to an example embodiment of inventive concepts may be configured to selectively use one of a single-ended transfer mode suitable for the SDR NAND flash memory and a differential transfer mode suitable for the DDR NAND flash memory during a data input/output operation.

Figure 15:
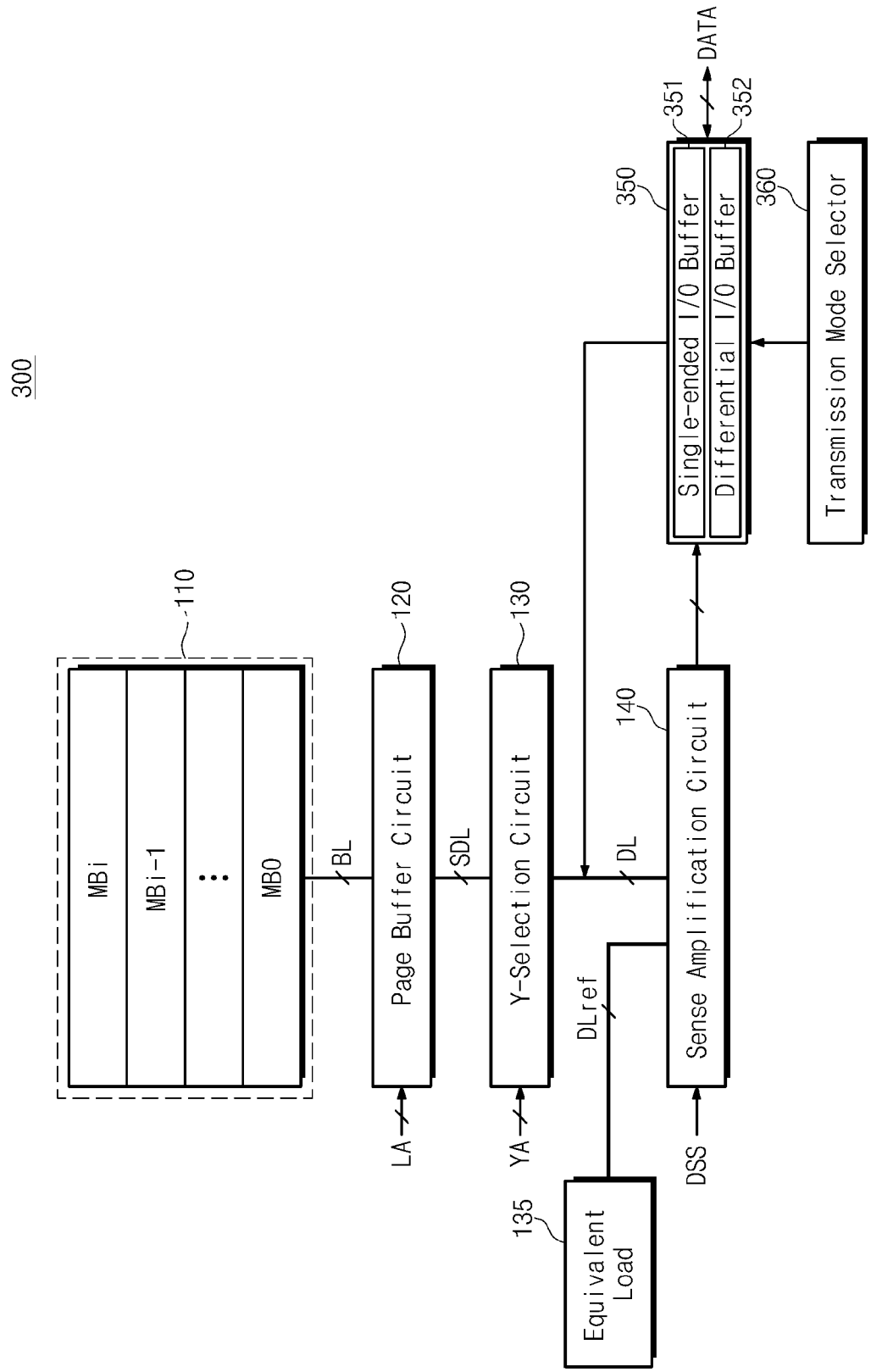
FIG. 15 is a diagram illustrating a nonvolatile memory device according to still another example embodiment of inventive concepts.

FIG. 15 is a diagram illustrating a nonvolatile memory device according to still another example embodiment of inventive concepts.

Referring to FIG. 15, a nonvolatile memory device 300 may include a memory cell array 110, a page buffer circuit 120, a column selection circuit 130, a sense amplification circuit 140, an input/output buffer 350, and a transmission mode selector 360. The memory cell array 110, the page buffer circuit 120, the column selection circuit 130, and the sense amplification circuit 140 may be configured the same or substantially the same as those in FIG. 1.

The input/output buffer 350 may receive data output from the sense amplification circuit 140 to output the data to an external device. The input/output buffer 350 may receive data from the external device to output the data to data lines DL. The input/output buffer 350 may include a single-ended input/output buffer 351 and a differential input/output buffer 352.

The single-ended input/output buffer 351 may input and output data in a single-ended transmission mode in response to the first transmission mode selection signal.

The differential input/output buffer 352 may input and output data in a differential transmission mode in response to the second transmission mode selection signal.

The transmission mode selector 360 may be configured to generate the first and second transmission mode selection signals. In an example embodiment, the transmission mode selector 360 may be configured to generate the first and second transmission mode selection signals according to configuration of a user or an e-fuse (or, register).

An example data input/output operation executed using any one of the single-ended transmission mode and the differential transmission mode is disclosed in U.S. Patent Publication No. 2008/0273623, the entirety of which is incorporated herein by reference.

The nonvolatile memory device 300 according to an example embodiment of inventive concepts may be implemented to use the single-ended transmission mode and the differential transmission mode during data input/output.

Inventive concepts are also applicable to vertical semiconductor memory devices (or, called a 3D semiconductor memory devices or VNANDs).

Figure 16:
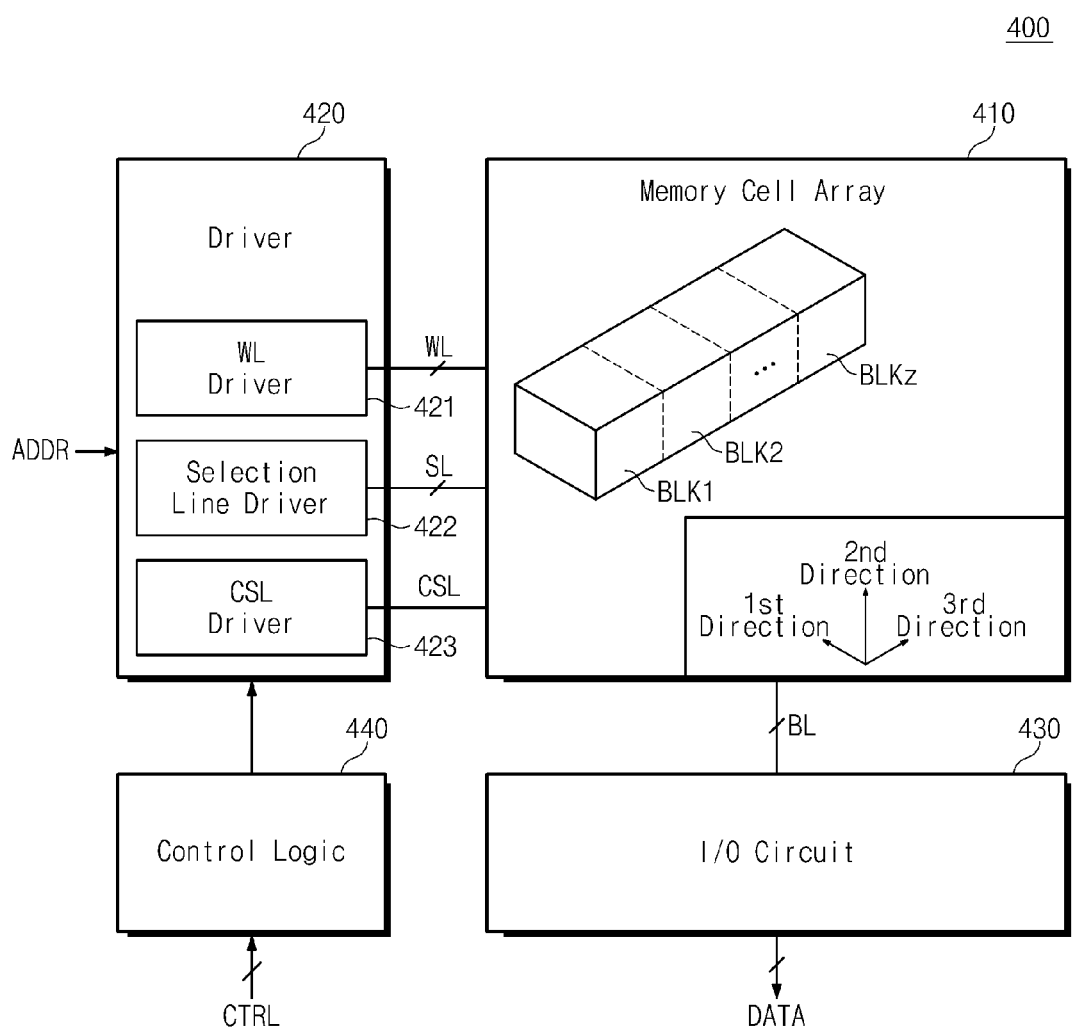
FIG. 16 is a diagram showing a non-volatile memory device according to still another example embodiment of inventive concepts.

FIG. 16 is a diagram showing a non-volatile memory device according to still another example embodiment of inventive concepts.

Referring to FIG. 16, a non-volatile memory device 400 may include a memory cell array 410, a driver 420, an input/output circuit 430, and control logic 440.

The memory cell array 410 may include a plurality of memory blocks BLK1 to BLKz, each of which includes a plurality of memory cells. Each of the memory blocks BLK1 to BLKz may have a vertical structure (or, a three-dimensional structure).

In this example embodiment, each of the memory blocks BLK1 to BLKz may include structures extending along the first to third directions. In this example embodiment, further, each of the memory blocks BLK1 to BLKz may include a plurality of vertical strings NS extending along the second direction. In this example embodiment, each of the memory blocks BLK1 to BLKz may further include a plurality of vertical strings NS extending along the first and third directions. Herein, the first to third directions may be orthogonal to each other.

Each of the vertical strings NS may be connected to one bit line BL, at least one string selection line SSL, at least one ground selection line GSL, word lines WL, and a common source line CSL. That is, each of the memory blocks BLK1 to BLKz may be connected to a plurality of bit lines BL, a plurality of string selection lines SSL, a plurality of ground selection lines GSL, a plurality of word lines WL, and a plurality of common source lines CSL.

The driver 420 may be connected to the memory cell array 410 via a plurality of word lines WL. The driver 420 may be configured to operate in response to the control of the control logic 440. The driver 420 may receive an address ADDR from an external device.

The driver 420 may be configured to decode the input address ADDR. Using the decoded address, the driver 420 may select one of the plurality of word lines WL. The driver 420 may be configured to apply voltages to selected and unselected word lines. In an example embodiment, during a program operation, a read operation and/or an erase operation, the driver 420 may supply word lines WL with a program voltage related to the program operation, a read voltage related to the read operation, and/or an erase voltage related to the erase operation. The driver 420 may include a word line driver 421, a selection line driver 422, and a common source line driver 423.

The input/output circuit 430 may be connected to the memory cell array 410 via a plurality of bit lines BL. The input/output circuit 430 may operate in response to the control of the control logic 440. The input/output circuit 430 may be configured to select a plurality of bit lines BL.

In an example embodiment, the input/output circuit 430 may receive data from an external device, randomize the input data, and store the randomized data in the memory cell array 410. The input/output circuit 430 may read data from the memory cell array 410, de-randomize or bypass the read data, and transfer the data to the external device.

The input/output circuit 430 may read data from the first storage region of the memory cell array 410 to store the data in the second storage region thereof. In an example embodiment, the input/output circuit 430 may be configured to perform a copy-back operation.

In an example embodiment, the input/output circuit 430 may include constituent elements such as a page buffer (or, a page register), a column selector circuit, a data buffer, and the like. In another example embodiment, the input/output circuit 430 may include constituent elements such as a sense amplifier, a write driver, a column selector circuit, a data buffer, and the like.

The control logic 440 may be configured to control an overall operation of the non-volatile memory device 400. The control logic 440 may operate responsive to control signals CTRL transferred from the external device.

Example vertical-type semiconductor memory devices are disclosed in U.S. Patent Publication Nos. 2009/0306583, 2010/0078701, 2010/0117141, 2010/0140685, 2010/0213527, 2010/0224929, 2010/0315875, 2010/0322000, 2011/0013458, and 2011/0018036, the entirety of all of which is incorporated herein by reference.

Figure 17:
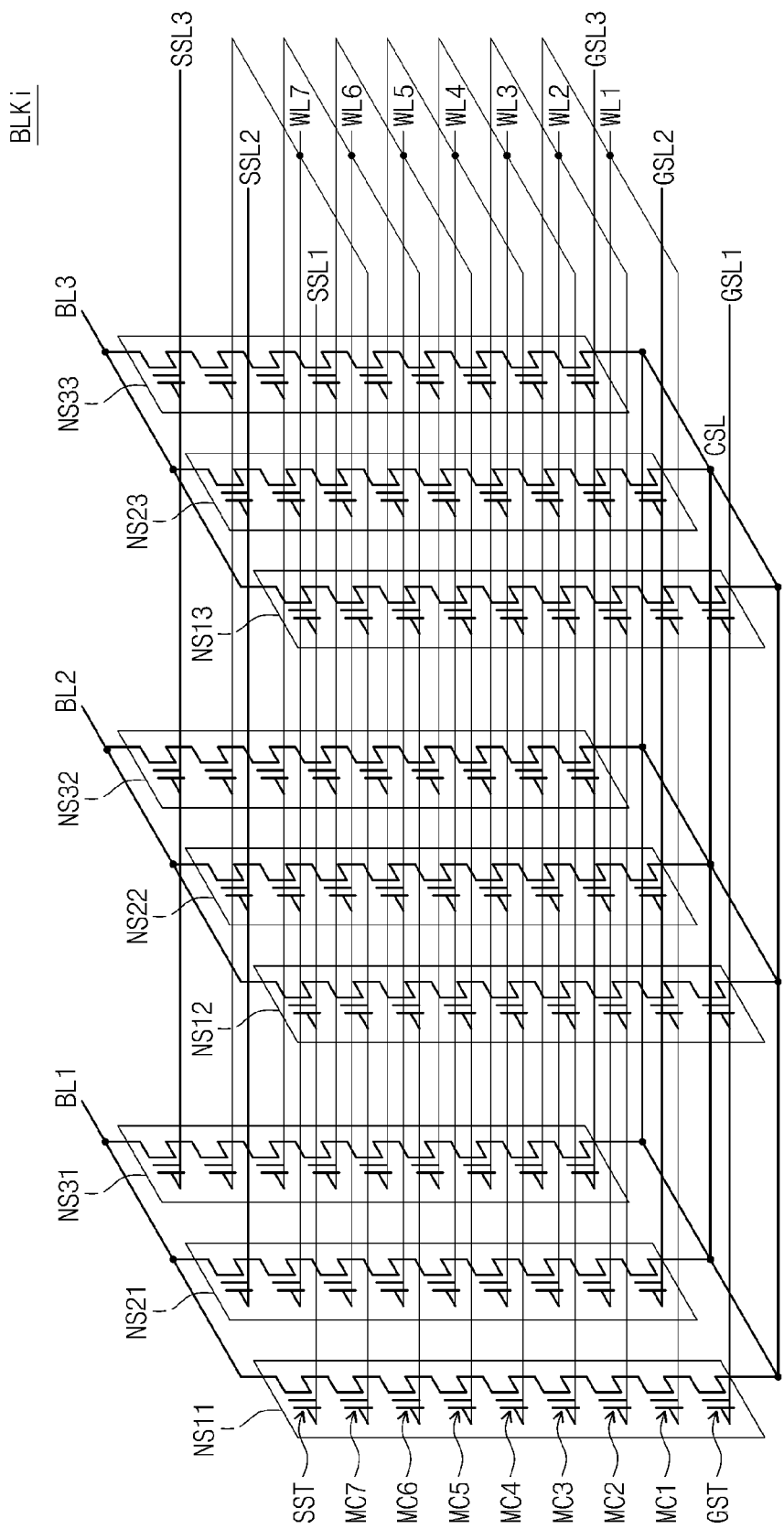
FIG. 17 is a circuit diagram showing an equivalent circuit of one memory block of memory blocks illustrated in FIG. 16.

FIG. 17 is a circuit diagram showing an equivalent circuit of one memory block of memory blocks illustrated in FIG. 16.

Referring to FIGS. 16 and 17, vertical strings NS11 to NS31 may exist between the first bit line BL1 and a common source line CSL. The first bit line BL1 may correspond to a conductive material extending in the third direction. Vertical strings NS12 to NS32 may exist between the second bit line BL2 and the common source line CSL. The second bit line BL2 may correspond to a conductive material extending in the third direction. Vertical strings NS13 to NS33 may exist between the third bit line BL3 and the common source line CSL. The third bit line BL3 may correspond to a conductive material extending in the third direction.

A string selection transistor SST in each vertical string NS may be connected to a corresponding bit line BL. A ground selection transistor GST in each vertical string NS may be connected to a common source line CSL. Memory cells MC may exist between the string selection transistor SST and the ground selection transistor GST in each vertical string NS.

Below, vertical strings NS may be defined by a row unit and a column unit. Vertical strings NS connected in common to one bit line may form a column. In an example embodiment, vertical strings NS11 to NS31 connected in common to a first bit line BL1 may correspond to the first column. Vertical strings NS21 to NS23 connected in common to the second bit line BL2 may correspond to the second column. Vertical strings NS13 to NS33 connected in common to the third bit line BL3 may correspond to the third column.

Vertical strings NS connected with one string selection line SSL may form one row. In an example embodiment, vertical strings NS11 to NS13 connected with the first string selection line SSL1 may form the first row. Vertical strings NS21 to NS23 connected with the second string selection line SSL2 may form the second row. Vertical strings NS31 to NS33 connected with the third string selection line SSL3 may form the third row.

In each vertical string NS, a height may be defined. In an example embodiment, in each vertical string, a height of a memory cell adjacent to a ground selection transistor GST may be about 1. In each vertical string NS, a height of a memory cell may increase in inverse proportion to a distance from a string selection transistor SST. In each vertical string, a height of a memory cell adjacent to the string selection transistor SST may be about 7.

Vertical strings NS in the same row may share a string selection line SSL. Vertical strings NS in different rows may be connected with different string selection lines SSL. In vertical strings of the same row, memory cells of the same or substantially the same height may share a word line. At the same or substantially the same height, word lines WL of vertical strings NS of different rows may be connected in common. In an example embodiment, word lines WL may be connected in common at a layer where conductive materials extending in a first direction are provided. In an example embodiment, the conductive materials extending in the first direction may be connected with an upper layer via a contact. Conductive materials extending in the first direction at the upper layer may be connected in common.

Vertical strings NS in the same row may share a ground selection line GSL. Vertical strings NS of different rows may be connected with different ground selection lines GSL.

A common source line CSL may be connected in common with vertical strings NS. In an example embodiment, the first to fourth doping regions may be connected at an active region of a substrate. In an example embodiment, the first to fourth doping regions may be connected with an upper layer via a contact. The first to fourth doping regions may be connected in common at the upper layer.

As illustrated in FIG. 17, word lines WL of the same or substantially the same depth may be connected in common. Accordingly, when a specific word line WL is selected, all vertical strings NS connected with the specific word line WL may be selected. Vertical strings NS of different rows may be connected with different string selection lines SSL. Accordingly, by selecting string selection lines SSL1 to SSL3, vertical strings of an unselected row among vertical strings NS connected with the same word line WL may be separated from bit lines BL1 to BL3. That is, a row of vertical strings NS may be selected by selecting string selection lines SSL1 to SSL3. Vertical strings NS of a selected row may be selected by a column unit by selecting the bit lines BL1 to BL3.

In FIGS. 1 to 17, an example sense amplification circuit is described using a nonvolatile memory device. However, it is well understood that there is no need to limit the sense amplification circuit to the nonvolatile memory device. The sense amplification circuit according to an example embodiment of inventive concepts is applicable to a volatile memory device.

FIGS. 18 to 25 show applications of a nonvolatile memory device according to an example embodiment of inventive concepts.

Figure 18:
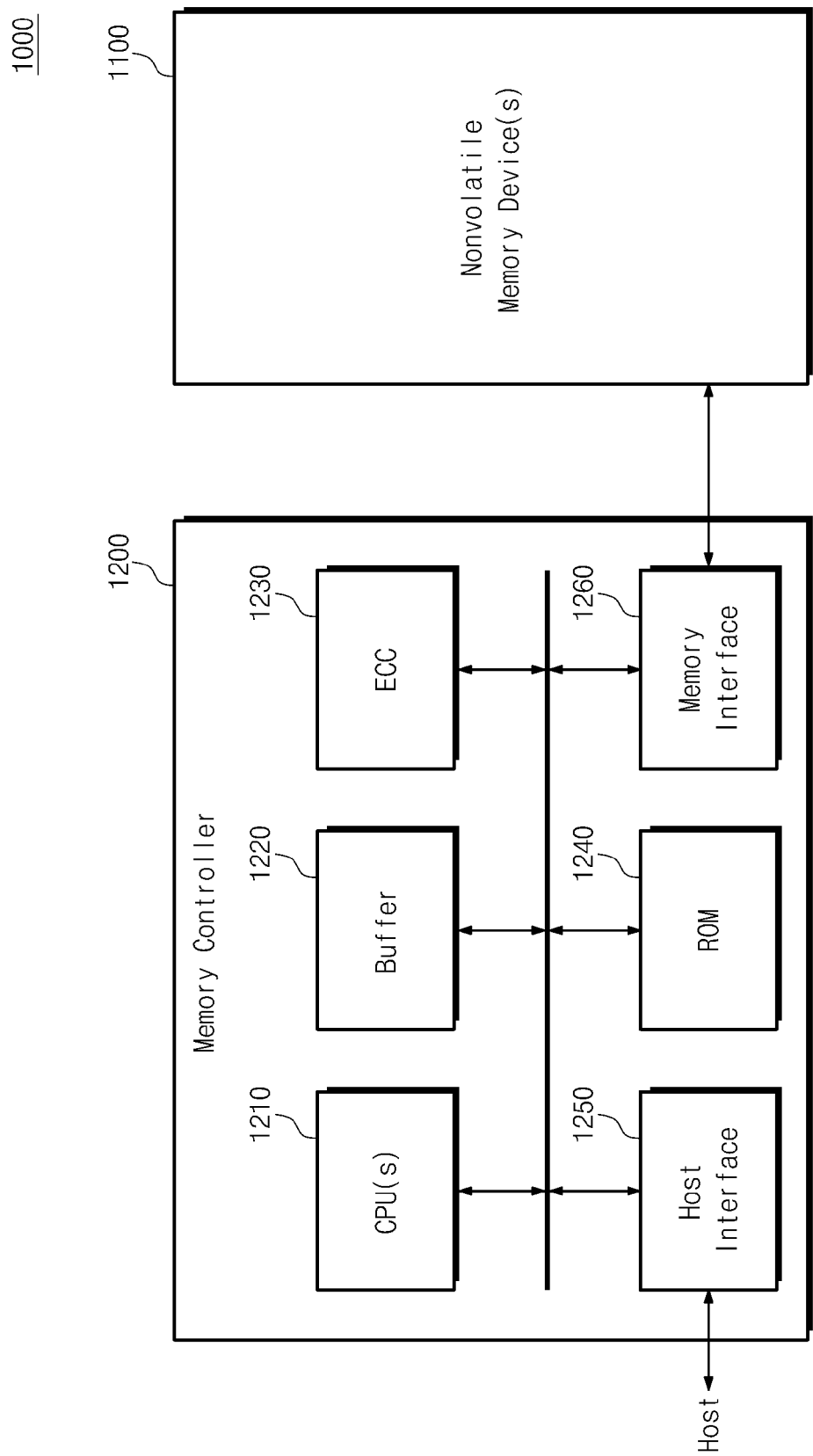
FIG. 18 is a diagram illustrating a memory system according to an example embodiment of inventive concepts.

FIG. 18 is a diagram illustrating a memory system according to an example embodiment of inventive concepts.

Referring to FIG. 18, a memory system 1000 may include a non-volatile memory device 1100 and a memory controller 1200.

The nonvolatile memory device 1100 may be implemented in the same or substantially the same manner as a non-volatile memory device 100 of FIG. 1, a non-volatile memory device 300 of FIG. 15, or a non-volatile memory device 400 of FIG. 16.

The memory controller 1200 may include at least one Central Processing Unit (CPU) 1210, a buffer 1220, an Error Correction Circuit (ECC) 1230, a Read-Only Memory (ROM) 1240, a host interface 1250, and a memory interface 1260. The memory system 1000 according to an example embodiment of inventive concepts is applicable to a perfect page new (PPN) memory.

Detailed description of an example memory system is disclosed in U.S. Patent Publication No. 2010/0082890, the entirety of which is incorporated herein by reference.

Figure 19:
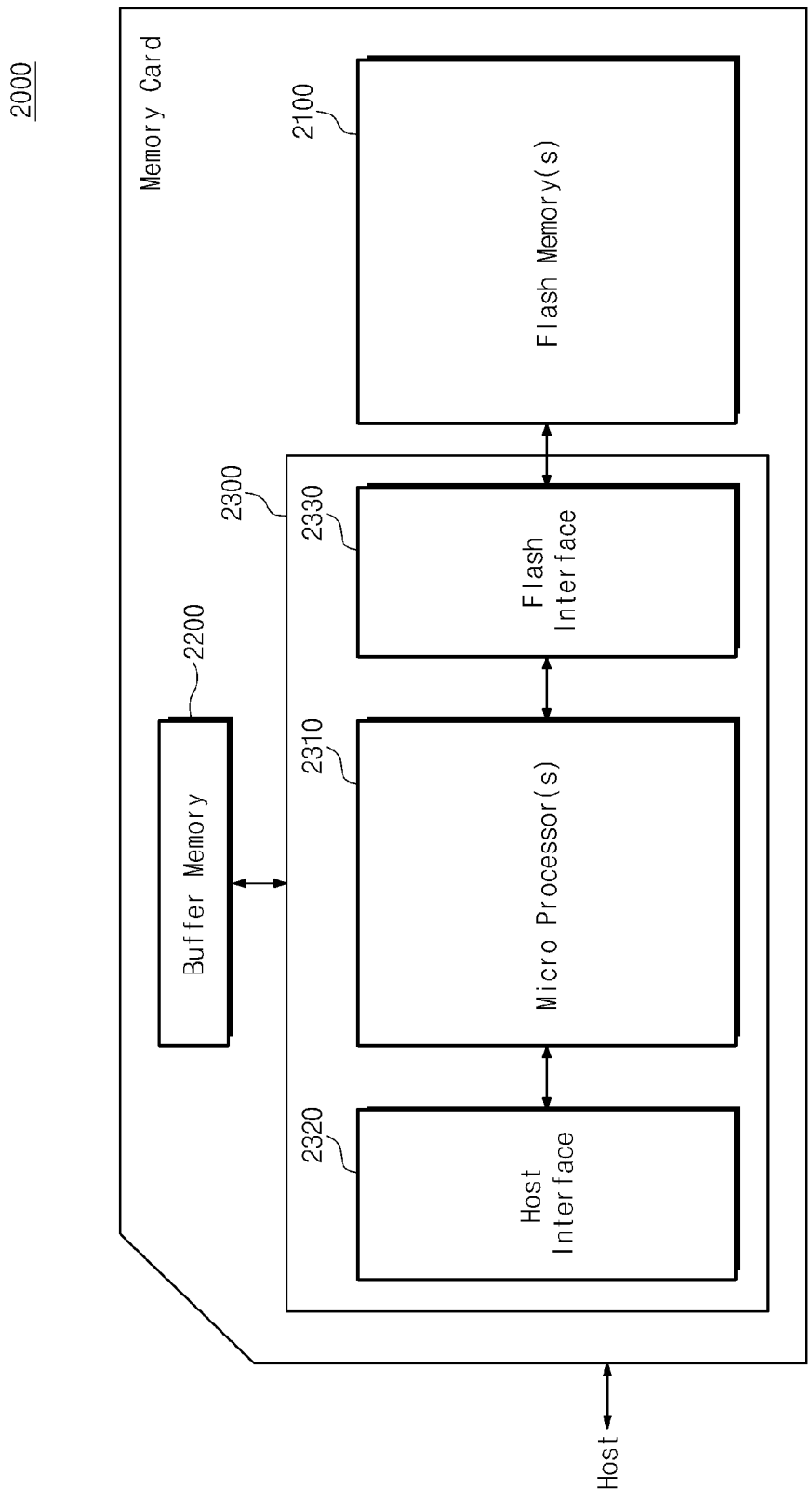
FIG. 19 is a block diagram of a memory card according to an example embodiment of inventive concepts.

FIG. 19 is a block diagram of a memory card according to an example embodiment of inventive concepts.

Referring to FIG. 19, a memory card 2000 may include at least one flash memory 2100, a buffer memory 2200, and a memory controller 2300 for controlling the flash memory 2100 and the buffer memory 2200.

The flash memory device 2100 may be implemented in the same or substantially the same manner as a non-volatile memory device 100 of FIG. 1, a non-volatile memory device 300 of FIG. 15, or a non-volatile memory device 400 of FIG. 16.

The buffer memory device 2200 may be used to temporarily store data generated during the operation of the memory card 2000. The buffer memory device 2200 may be implemented using a dynamic random access memory (DRAM) or a static random access memory (SRAM).

The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330.

The microprocessor 2310 may be configured to drive firmware. The host interface 2320 may interface with the host via a card (e.g., MMC) protocol for data exchanges between the host and the memory interface 2330.

The memory card 2000 may be applicable to Multimedia Cards (MMCs), Security Digitals (SDs), miniSDs, memory sticks, smartmedia, transflash cards, etc.

A detailed description of an example memory card 2000 is disclosed in U.S. Patent Publication No. 2010/0306583, the entirety of which is incorporated herein by reference.

Figure 20:
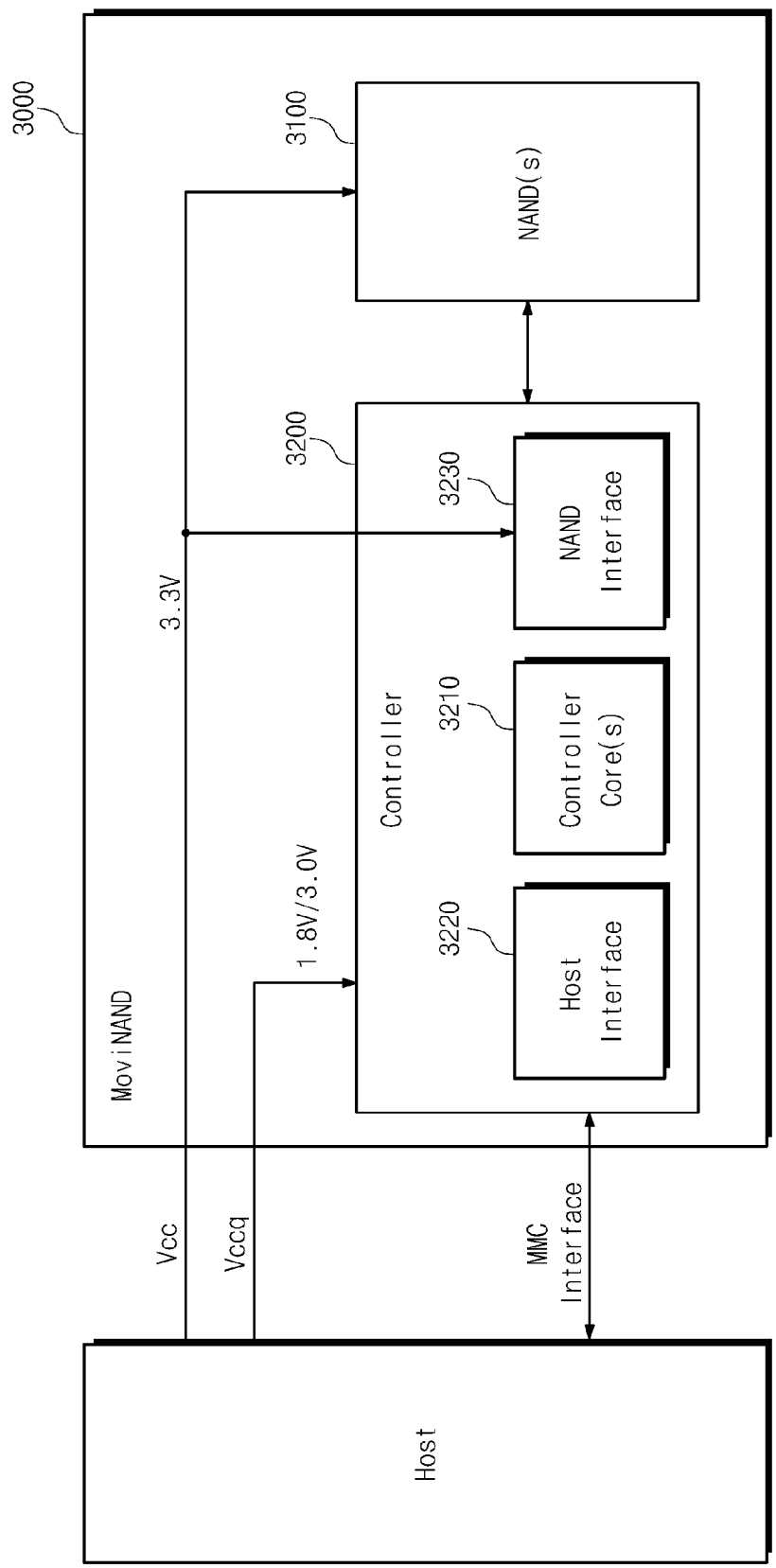
FIG. 20 is a block diagram of a moviNAND according to an example embodiment of inventive concepts.

FIG. 20 is a block diagram of a moviNAND according to an example embodiment of inventive concepts.

Referring to FIG. 20, a moviNAND device 3000 may include a NAND flash memory device 3100 and a controller 3200. The moviNAND device 3000 may support the MMC 4.4 (called eMMC) standard.

The NAND flash memory device 3100 may be formed by a stack of unitary NAND flash memories in a package (e.g., Fine-pitch Ball Grid Array (FBGA)). The unitary NAND flash memory device may be implemented in the same or substantially the same manner as a non-volatile memory device 100 of FIG. 1, a non-volatile memory device 300 of FIG. 15, or a non-volatile memory device 400 of FIG. 16.

The controller 3200 may include at least one controller core 3210, a host interface 3220, and a NAND interface 3230. The controller core 3210 may control an overall operation of the moviNAND device 3000. The host interface 3220 may be configured to perform an MMC interface between the controller 3210 and a host. The NAND interface 3230 may be configured to interface between the NAND flash memory device 3100 and the controller 3200.

The moviNAND device 3000 may receive power supply voltages Vcc and Vccq from the host. Herein, the power supply voltage Vcc (about 3V) may be supplied to the NAND flash memory device 3100 and the NAND interface 3230, while the power supply voltage Vccq (about 1.8V/3V) is supplied to the controller 3200.

The moviNAND 300 according to an example embodiment of inventive concepts may be advantageous in storing mass data as well as having improved read characteristics. The moviNAND 3000 according to an example embodiment of inventive concepts is applicable to relatively small and low-power mobile products (e.g., smartphones, such as, a Galaxy S, iPhone, etc).

Inventive concepts are also applicable to a solid state drive (SSD).

Figure 21:
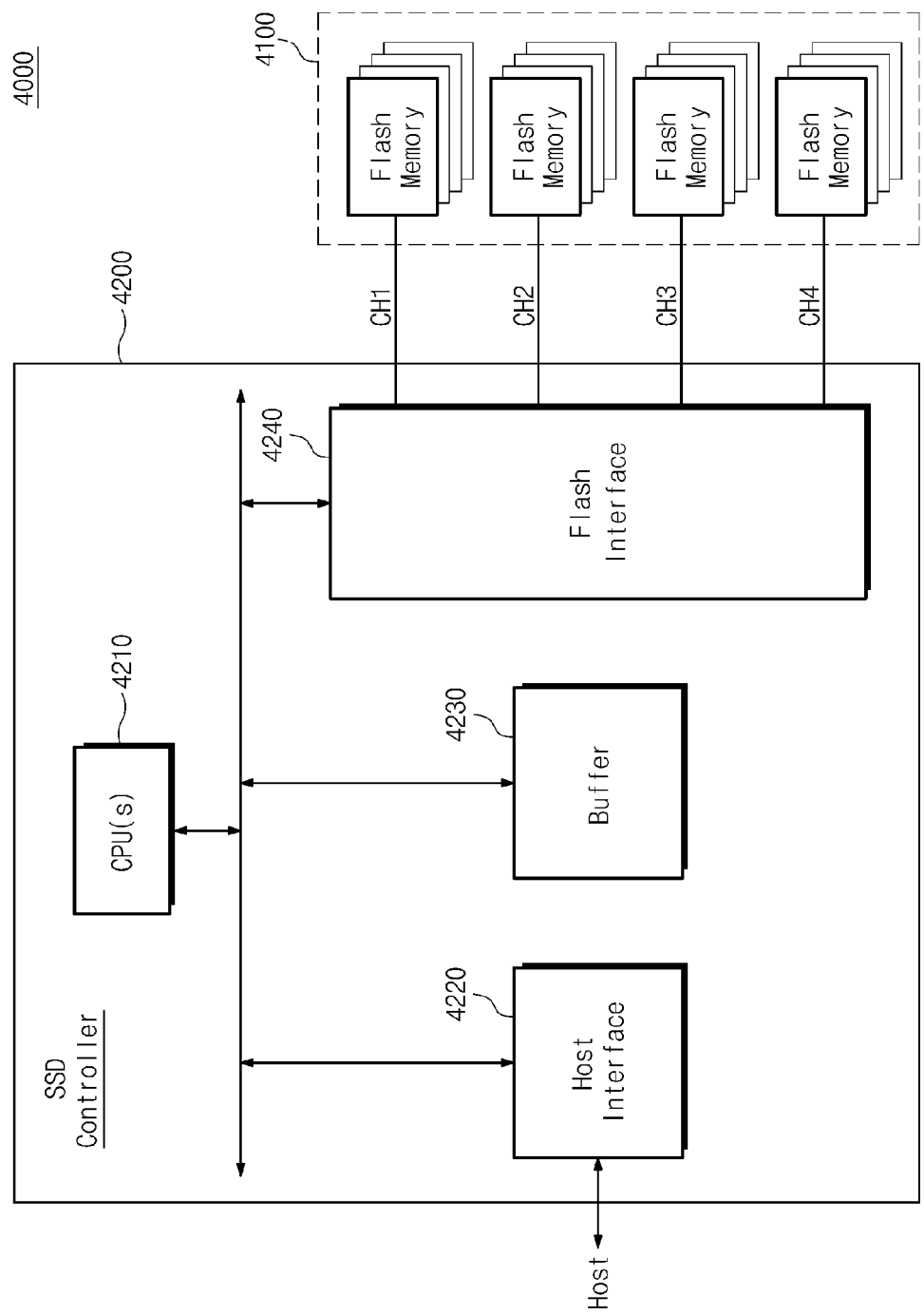
FIG. 21 is a block diagram of an SSD according to an example embodiment of inventive concepts.

FIG. 21 is a block diagram of an SSD according to an example embodiment of inventive concepts.

Referring to FIG. 21, an SSD 4000 may include a plurality of flash memory devices 4100 and an SSD controller 4200. Each of the flash memory devices 4100 may be implemented in the same or substantially the same manner as a non-volatile memory device 100 of FIG. 1, a non-volatile memory device 300 of FIG. 15, or a non-volatile memory device 400 of FIG. 16.

The SSD controller 4200 may control the plurality of flash memory devices 4100. The SSD controller 4200 may include at least one CPU 4210, a host interface 4220, a buffer 4230, and a flash interface 4240.

Under the control of the CPU 4210, the host interface 4220 may exchange data with a host through the ATA protocol. The host interface 4220 may be one of a Serial Advanced Technology Attachment (SATA) interface, a Parallel Advanced Technology Attachment (PATA) interface, and an External SATA (ESATA) interface. Data to be received or transmitted from or to the host through the host interface 4220 may be delivered through the buffer 4230 without passing through a CPU bus, under the control of the CPU 4210.

The buffer 4230 may temporarily store data transferred between an external device and the flash memory devices 4100. The buffer 4230 may be used to store programs to be executed by the CPU 4210. The buffer 4230 may be implemented using a SRAM. The buffer 4230 in FIG. 21 may be included within the SSD controller 4200. However, the inventive concepts are not limited thereto. The buffer 4230 according to an example embodiment of inventive concepts may be provided at an outside of the SSD controller 4200.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 4000 according to an example embodiment of inventive concepts may improve the reliability of stored data by storing random data during a program operation. A more detailed description of an example of the SSD 4000 is disclosed in U.S. Patent Publication No. 2010/0082890, the entirety of which is incorporated herein by reference.

Figure 22:
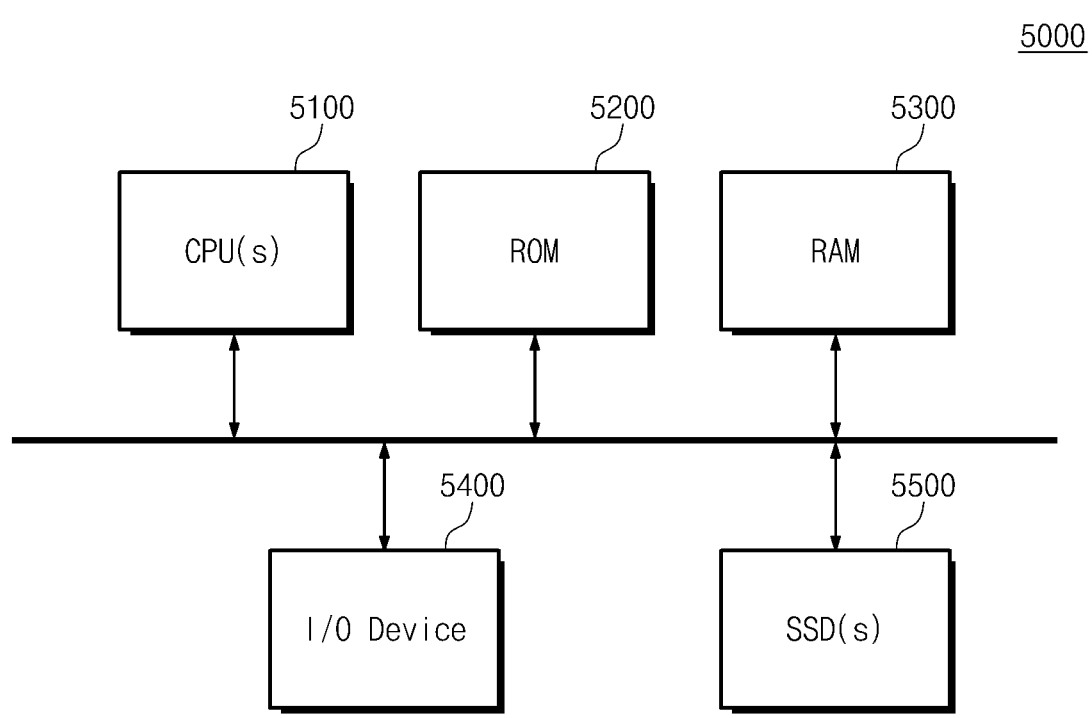
FIG. 22 is a block diagram of a computing system including an SSD in FIG. 21 according to an example embodiment of inventive concepts.

FIG. 22 is a block diagram of a computing system including an SSD in FIG. 21 according to an example embodiment of inventive concepts.

Referring to FIG. 22, a computing system 5000 may include at least one CPU 5100, a ROM 5200, a RAM 5300, an input/output (I/O) device 5400, and at least one SSD 5500.

The at least one CPU 5100 may be connected to a system bus. The ROM 5200 may store data used to drive the computing system 5000. Herein, the data may include a start command sequence or a basic I/O system (BIOS) sequence. The RAM 5300 may temporarily store data generated during the execution of the CPU 5100.

The I/O device 5400 may be connected to the system bus through an I/O device interface such as keyboards, pointing devices (e.g., mouse), monitors, modems, and the like.

The SSD 5500 may be a readable storage device and may be implemented in the same or substantially the same manner as the SSD 4000 of FIG. 11.

Figure 23:
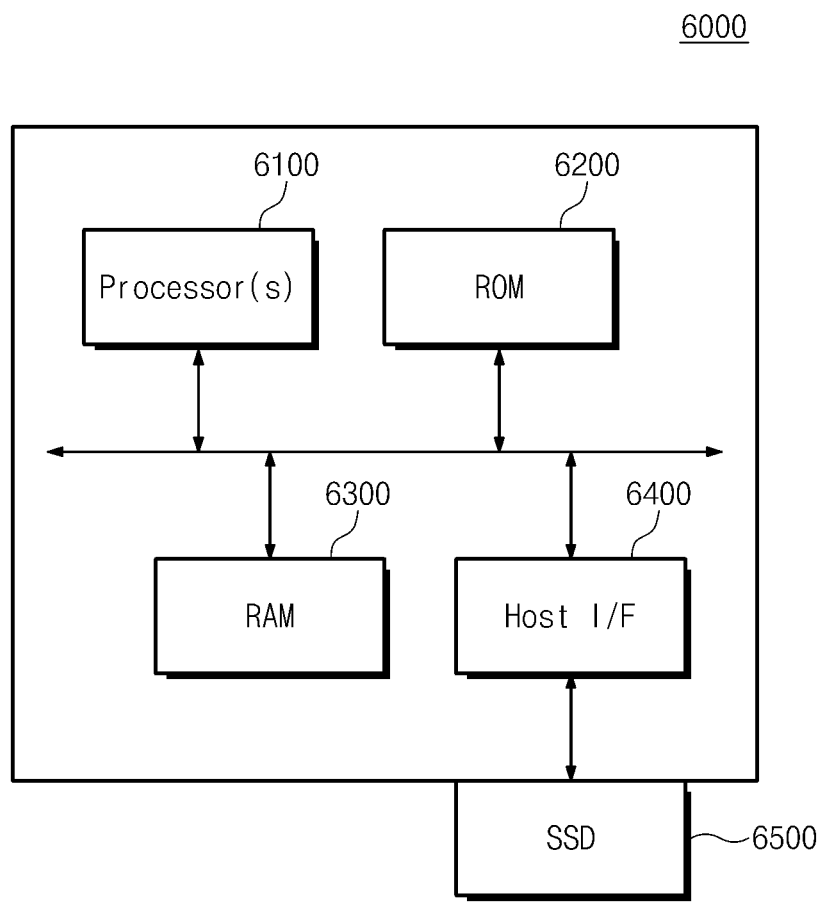
FIG. 23 is a block diagram of an electronic device including an SSD in FIG. 21 according to an example embodiment of inventive concepts.

FIG. 23 is a block diagram of an electronic device including an SSD in FIG. 21 according to an example embodiment of inventive concepts.

Referring to FIG. 23, an electronic device 6000 may include at least one processor 6100, a ROM 6200, a RAM 6300, a flash interface 6400, and an SSD 6500.

The at least one processor 6100 may access the RAM 6300 to execute firmware codes or other codes. Also, the processor 6100 may access the ROM 6200 to execute fixed command sequences such as a start command sequence and a basic I/O system (BIOS) sequence. The flash interface 6400 may be configured to interface between the electronic device 6000 and the SSD 6500. The SSD 6500 may be detachable from the electronic device 6000. The SSD 6500 may be implemented the same as the SSD 4000 of FIG. 21.

The electronic device 6000 may include cellular phones, personal digital assistants (PDAs), digital cameras, camcorders, portable audio players (e.g., MP3), portable media players (PMPs), etc.

Figure 24:
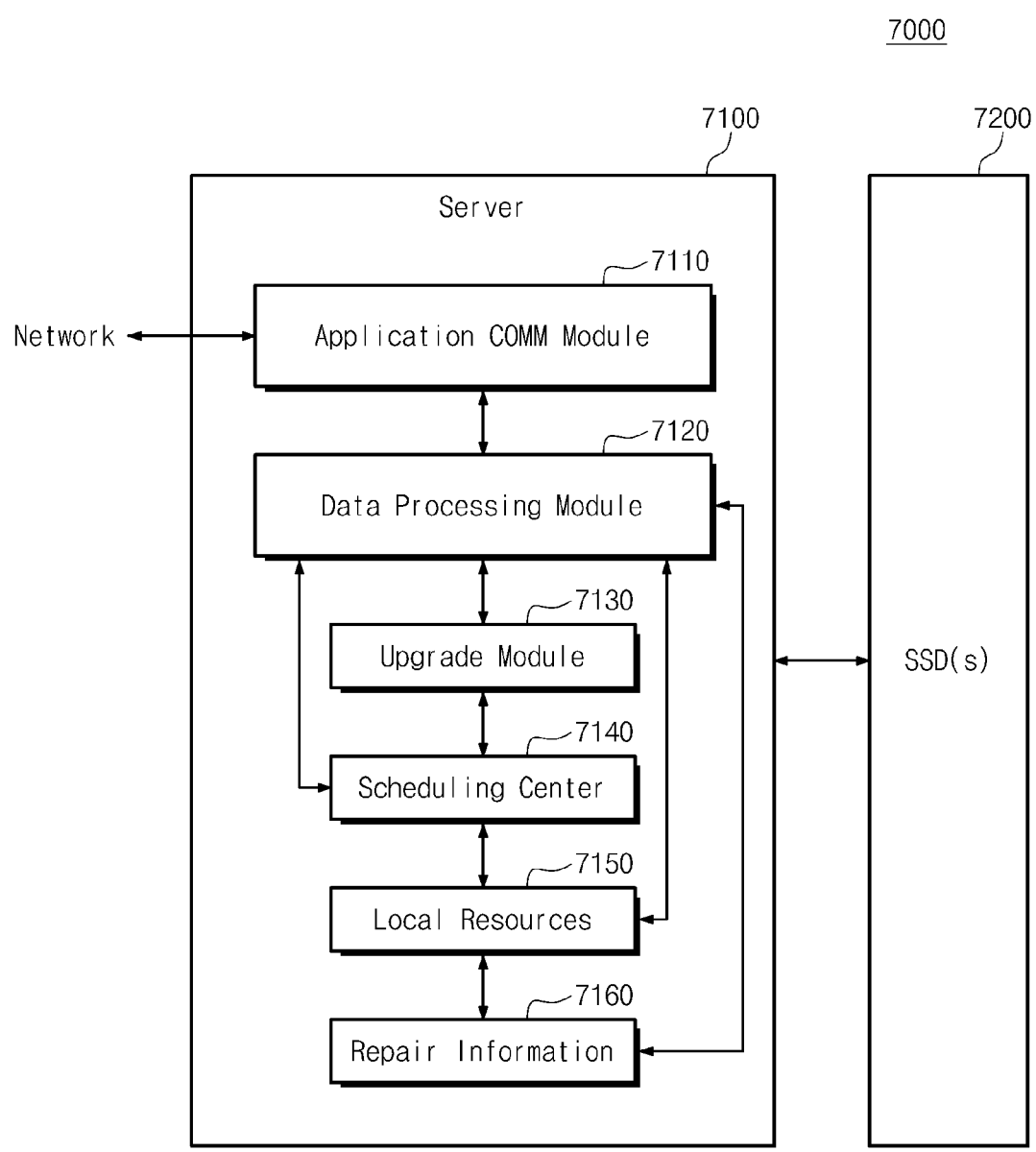
FIG. 24 is a block diagram of a server system including an SSD in FIG. 21 according to an example embodiment of inventive concepts.

FIG. 24 is a block diagram of a server system including an SSD in FIG. 21 according to an example embodiment of inventive concepts.

Referring to FIG. 24, a server system 7000 may include at least one server 7100 and an SSD 7200 that stores data used to drive the server 7100. The SSD 7200 may be configured in the same or substantially the same manner as an SSD 4000 of FIG. 21.

The server 7100 may include an application communication module 7110, a data processing module 7120, an upgrade module 7130, a scheduling center 7140, a local resource module 7150, and a repair information module 7160.

The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100.

The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100.

The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

A non-volatile memory device according to an example embodiment of inventive concepts is applicable to tablet products (e.g., Galaxy Tab, iPad, etc.).

Figure 25:
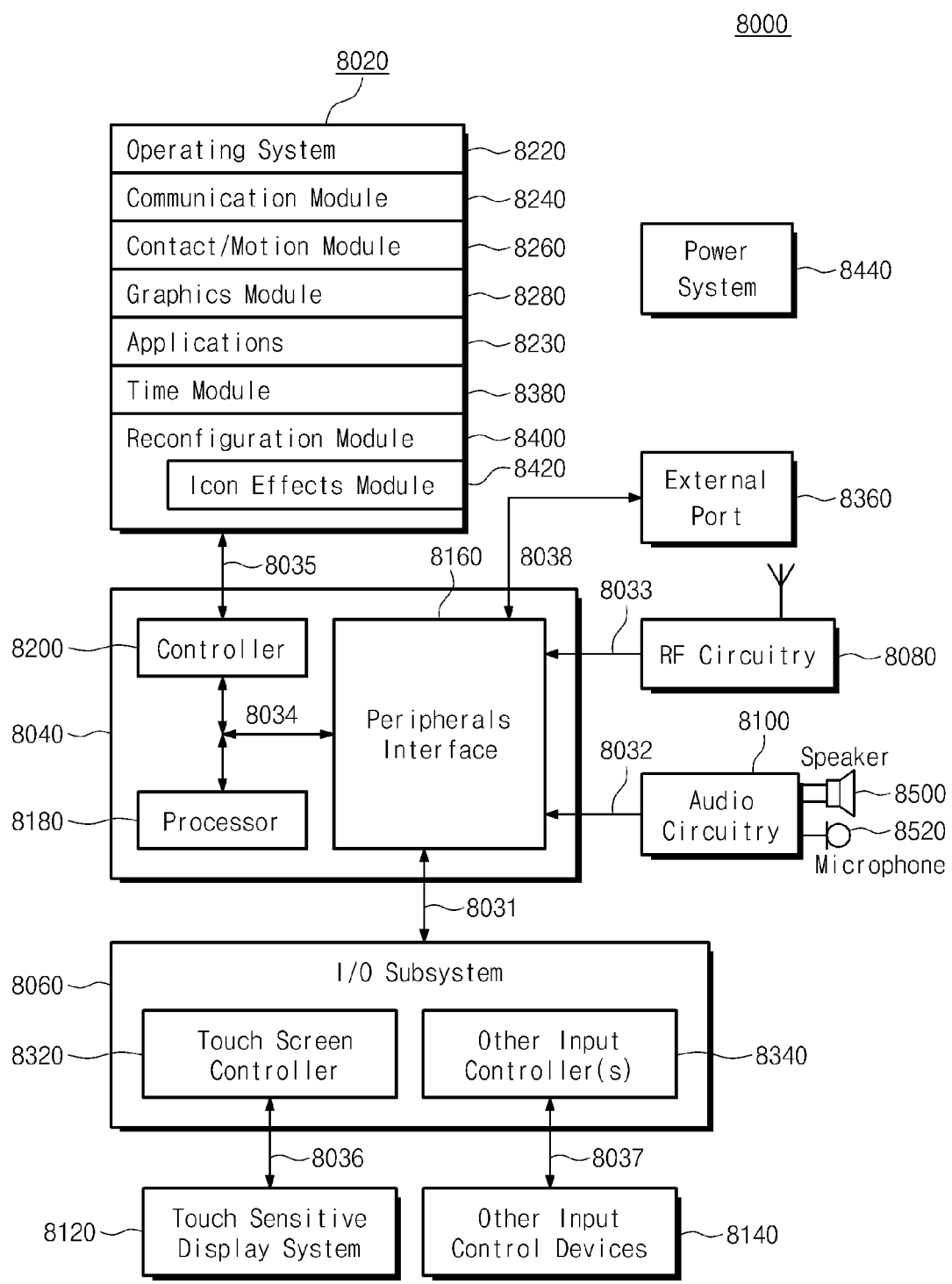
FIG. 25 is a diagram showing a handheld electronic device according to an example embodiment of inventive concepts.

FIG. 25 is a diagram showing a handheld electronic device according to an example embodiment of inventive concepts.

Referring to FIG. 25, a handheld electronic device 8000 may include at least one computer-readable media 8020, a processing system 8040, an input/output sub-system 8060, a radio frequency circuit 8080, and an audio circuit 8100. Respective constituent elements may be interconnected by at least one communication bus or a signal line 8030.

The handheld electronic device 8000 may be any handheld electronic device including a handheld computer, a tablet computer, a mobile phone, a media player, a PDA, or a combination of at least two elements thereof. Herein, the at least one computer-readable media 8020 includes at least one non-volatile memory device 100 in FIG. 1. A more detailed description of an example of the handheld electronic device 800 is disclosed in U.S. Pat. No. 7,509,588, the entirety of which is incorporated herein by reference.

Memory systems or storage devices according to example embodiments of inventive concepts may be mounted in various types of packages. Examples of the packages of the memory system or the storage device according to example embodiments of inventive concepts may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Nonvolatile memory devices according to example embodiments of inventive concepts may perform a high-speed data output operation by outputting data according to a differential sensing method. Further, nonvolatile memory devices according to example embodiment of inventive concepts may reduce a layout area by differentially sensing data lines and corresponding reference data lines.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An output circuit comprising:
   a plurality of page buffer latches configured to latch data read from a plurality of memory cells;
   a plurality of sub data lines configured to receive voltages corresponding to the latched data in response to latch addresses;
   a data line connected to the plurality of sub data lines;
   a reference data line to which a current path is formed during a sensing operation; and
   a sense amplification circuit configured to, during the sensing operation, sense a voltage difference between the reference data line and the data line, and to output data corresponding to the sensed voltage difference.

2. The output circuit of claim 1, further comprising:
   a column selection circuit configured to connect the data line with the plurality of sub data lines sequentially in response to a plurality of column addresses.

3. The output circuit of claim 2, wherein the column selection circuit comprises:
   a plurality of column selection transistors, each of the plurality of column selection transistors being configured to connect a sub data line from among the plurality of sub data lines with the data line in response to a column address from among the plurality of column addresses.

4. The output circuit of claim 2, wherein the reference data line is coupled to a load element having a load corresponding to a load of the data line.

5. The output circuit of claim 1, wherein the sense amplification circuit comprises:
   a pre-charge circuit configured to pre-charge the reference data line and the data line;
   a current path generator configured to form the current path to the reference data line after the reference data line and the data line are pre-charged; and
   a differential sense amplifier configured to sense the voltage difference between the reference data line and the data line.

6. The output circuit of claim 5, wherein the pre-charge circuit comprises:
   at least one first transistor configured to apply a power supply voltage to the reference data line and the data line in response to a pre-charge signal.

7. The output circuit of claim 5, wherein the current path generator electrically connects the reference data line to a ground terminal during the sensing operation.

8. The output circuit of claim 5, wherein the current path generator changes a voltage of the reference data line during the sensing operation.

9. The output circuit of claim 8, wherein the current path generator is configured to lower a voltage of the reference data line during the sensing operation, and wherein a slope of a voltage of the reference data line is less than a slope of a voltage of the data line when the latched data is indicative of a decrease in the voltage of the data line.

10. The output circuit of claim 9, wherein a variation in the voltage of the reference data line is less than a variation in the voltage of the data line.

11. The output circuit of claim 10, wherein, when performing the sensing operation, a variation in the voltage of the reference data line is between voltage values corresponding to the latched data.

12. The output circuit of claim 8, wherein the current path generator comprises:
   at least one current path transistor connected between the reference data line and a path node, the at least one current path transistor having a gate configured to receive a trim code; and
   a path forming transistor configured to connect the path node with a ground terminal in response to an inverted pre-charge signal.

13. The output circuit of claim 12, wherein the trim code varies according to an address for determining a physical location of a page buffer.

14. The output circuit of claim 12, wherein the trim code is implemented by at least one of an e-fuse, a laser fuse, and a register set.

15. The output circuit of claim 5, wherein the differential sense amplifier comprises:

a first transistor connected between a power terminal and an output node, the first transistor having a gate connected to an inverted output node;

a second transistor connected between the power terminal and the inverted output node, the second transistor having a gate connected to the output node;

a third transistor connected between the output node and a bias node, the third transistor having a gate connected to the inverted output node;

a fourth transistor connected between the inverted output node and the bias node, the fourth transistor having a gate connected to the output node; and a fifth transistor configured to connect the bias node and a ground terminal during the sensing operation.

16. An output circuit comprising:

a sense amplification circuit configured to, during a sensing operation, generate output data based on a comparison between a first voltage on a data line and a reference voltage on a reference data line during a sensing operation, the first voltage corresponding to data read from at least one memory cell, and the sense amplification circuit being further configured to connect the reference data line with a ground terminal during the sensing operation.

17. The output circuit of claim 16, wherein the sense amplification circuit is configured to generate the output data while the reference data line is connected to the ground terminal.

18. The output circuit of claim 16, further comprising:

at least one page buffer latch configured to latch the data read from at least one memory cell.

19. The output circuit of claim 18, further comprising:

a column selection circuit configured to connect the data line with the at least one page buffer in response to a column address signal.

20. The output circuit of claim 16, wherein the sense amplification circuit comprises:

a differential sense amplifier configured to, during the sensing operation, compare the first voltage and the reference voltage, and to generate the output data based on the comparison; and a current path generating circuit configured to connect the reference data line with the ground terminal during the sensing operation.

21. The output circuit of claim 20, wherein the sense amplification circuit further comprises:

a pre-charge circuit configured to pre-charge the reference data line and the data line in response to a pre-charge signal, wherein the current path generating circuit is configured to connect the reference data line with the ground terminal based on a trim code and an inverted pre-charge signal.

* * * * *